(12) United States Patent
Arakawa et al.

(10) Patent No.: US 7,271,488 B2
(45) Date of Patent: Sep. 18, 2007

(54) SEMICONDUCTOR INTEGRATED CIRCUIT

(75) Inventors: Tomofumi Arakawa, Tokyo (JP);
Mutsuhiro Ohmori, Kanagawa (JP)

(73) Assignee: Sony Corporation (JP)

( * ) Notice: Subject to any disclaimer, the term of this patent is extended or adjusted under 35 U.S.C. 154(b) by 65 days.

(21) Appl. No.: 11/312,709

(22) Filed: Dec. 21, 2005

(65) Prior Publication Data
US 2006/0151883 A1 Jul. 13, 2006

(30) Foreign Application Priority Data
Jan. 11, 2005 (JP) ............................ P2005-003781

(51) Int. Cl.
*H01L 23/48* (2006.01)
*H01L 23/52* (2006.01)
*H01L 29/40* (2006.01)

(52) U.S. Cl. ................ 257/758; 257/780; 257/781; 257/E23.144; 257/E23.145

(58) Field of Classification Search ............... 257/758, 257/E23.145
See application file for complete search history.

(56) References Cited

U.S. PATENT DOCUMENTS

| 4,884,118 | A | * | 11/1989 | Hui et al. ................... 257/206 |
| 5,220,490 | A | * | 6/1993 | Weigler et al. ............. 361/777 |
| 5,898,194 | A | * | 4/1999 | Gheewala ................... 257/206 |
| 6,194,912 | B1 | * | 2/2001 | Or-Bach ...................... 326/38 |
| 6,453,447 | B1 | * | 9/2002 | Gardner et al. ................ 716/3 |
| 6,476,493 | B2 | | 11/2002 | Or-Bach et al. |
| 6,756,811 | B2 | * | 6/2004 | Or-Bach ...................... 326/41 |
| 6,885,043 | B2 | * | 4/2005 | Smith et al. ................ 257/202 |
| 7,105,871 | B2 | * | 9/2006 | Or-Bach et al. ............ 257/203 |
| 2005/0056936 | A1 | * | 3/2005 | Jan ............................. 257/758 |
| 2006/0113567 | A1 | * | 6/2006 | Ohmori et al. ............. 257/202 |

\* cited by examiner

*Primary Examiner*—B. William Baumeister
*Assistant Examiner*—Igwe U. Anya
(74) *Attorney, Agent, or Firm*—Rader Fishman & Grauer PLLC; Ronald P. Kananen

(57) ABSTRACT

A semiconductor integrated circuit having a plurality of interconnect layers and at least one via connecting interconnects of two adjacent interconnect layers, wherein each interconnect layer has a plurality of first interconnect groups and second interconnect groups arranged respectively in a row and a column in a matrix. The first and the second interconnect groups are alternately arranged in each row and in each column of the matrix arranged facing each other between two adjacent interconnect layers. The first and second interconnect groups facing each other between the layers have crossing parts where they can be connected through vias.

10 Claims, 19 Drawing Sheets

SEMICONDUCTOR INTEGRATED CIRCUIT

CROSS REFERENCES TO RELATED APPLICATIONS

The present invention contains subject matter related to Japanese Patent Application No. 2005-003781 filed in the Japan Patent Office on Jan. 11, 2006, the entire contents of which being incorporated herein by reference.

BACKGROUND OF THE INVENTION

1. Field of Invention

The present invention relates to a gate array or an ASIC (Applied Specific IC or Structured Application Specific IC) or other semiconductor integrated circuit having a regular layout.

2. Description of the Related Art

A gate array type semiconductor integrated circuit uses a mask for patterning of the interconnects, so it is necessary prepare different masks for individual circuit designs. For this reason, further, a new mask must be provided whenever a circuit is corrected or changed.

On the other hand, in a so-called field programmable gate array (FPGA) type of semiconductor integrated circuit enabling programming of the logical functions, already laid out interconnects are selected by transistor switches to configure the desired circuit. For this reason, an FPGA has the advantage that the circuit configuration can be flexibly changed. However, there is the problem that the presence of transistor switches in the interconnect routes results in a large signal delay and a slower operation speed in comparison with a gate array. Further, since transistor switches must be used for connecting perpendicular interconnects, if the number of transistors is insufficient, the available interconnect resources become small and it becomes difficult to configure the desired circuit. In order to prevent such circumstances, many switch transistors must be provided, so there arises the problem of enlargement of the circuit area.

In recent years, a structured ASIC type of semiconductor integrated circuit enabling higher speed operation than an FPGA and, at the same time, able to be changed in circuit configuration more flexibly than a gate array has appeared.

In a structured ASIC, circuit cells having structures larger in size than the basic gates of a NAND circuit are used as the smallest units of the circuit. A circuit having the desired function is configured by mask routing for customizing part of the interconnects in accordance with the application unlike the FPGA explained above. The reconfigurable interconnect structure in an FPGA is very wasteful. If replacing this by mask routing, a circuit with greater waste than with a gate array, but much less waste than an FPGA can be developed in a short period.

As related art regarding the interconnect structure of a structured ASIC, for example, there is U.S. Pat. No. 6,476,493. The semiconductor device disclosed in U.S. Pat. No. 6,476,493 has first, second, and third metal layers. Each metal layer is formed with a plurality of parallel interconnects (strips). The interconnects of a certain metal layer are formed extending in a direction perpendicular to the interconnects of the metal layer just above or just beneath that metal layer. By the arrangement of the plurality of these interconnects side by side, a band structure is formed. Vias connecting these interconnects to each other and custom interconnects formed in the metal layers are used to form the desired interconnect pattern.

FIG. 17 is a first view of an example of an interconnect structure used in a structured ASIC. In the interconnect structure shown in FIG. 17, a plurality of parallel interconnects each having a constant length are formed in an a-th layer (a indicates any natural number) and an (a+1)-th layer above this layer. The interconnects of the a-th layer and the (a+1)-th layer are formed extending in directions perpendicular to each other. These plurality of parallel interconnects are arranged side by side in a direction vertical to the direction in which interconnects extend. A single band structure is formed by this array. Regular interconnect structures are formed in the a-th layer and the (a+1)-th layer by a repetition of the above band structure. Circuit cells are arrayed in a matrix along these band structures. The connections between circuit cells are customized by vias formed between the layers and jumper interconnects formed in an (a+2)-th layer.

In the interconnect structure shown in FIG. 17, to connect circuit cells, two vias and a jumper interconnect of the (a+2)-th layer are necessary as illustrated. Namely, a signal cannot be transmitted between circuit cells unless the signal passes through at least two vias. In general, the resistance value of a via is high; therefore, when the number of vias inserted in a signal route increases, there arises the disadvantage that the signal delay becomes large.

Further, in the interconnect structure shown in FIG. 17, two vias are needed in order to connect circuit cells; therefore, two interconnects become necessary for forming these vias. For example, when connecting two laterally arranged circuit cells, the two vertical interconnects at the boundary part of two circuit cells are used for forming the vias. The interconnect originally used for transmitting the signal in the vertical direction is used only for transferring the signal to the lateral direction; therefore, there is a problem of wasteful consumption of interconnect resource.

FIG. 18 is a second view of an example of an interconnect structure used in a structured ASIC. The interconnect structure shown in FIG. 18 is substantially the same as the interconnect structure shown in FIG. 17 concerning the a-th layer and the (a+1)-th layer. The interconnect structure shown in FIG. 18 is different from the interconnect structure shown in FIG. 17 in the point that a larger number of custom interconnects are formed in the (a+2)-th layer.

According to the interconnect structure shown in FIG. 18, a custom interconnect of the (a+2)-th layer is positively used for connecting circuit cells; therefore, there is the advantage that the interconnect resources of the a-th layer and the (a+1)-th layer can be saved. However, there is a possibility of the problem of a shortage arising in the interconnect resources of the (a+2)-th layer along with the increase of the interconnects of the (a+2)-th layer. Further, when forming the custom interconnects of the (a+2)-th layer by an electron beam (EB) system, etc., there arises the problem that the larger the amount of interconnects, the longer the processing time of the patterning.

FIG. 19 is a third view of an example of an interconnect structure used in a structured ASIC. The interconnect structure shown in FIG. 19 uses only vias for customizing the interconnects. The jumper interconnect of the (a+2)-th layer used for connecting circuit cells in the interconnect structure shown in FIG. 17 is replaced by jumper interconnects previously formed in the a-th layer and the (a+1)-th layer in the interconnect structure shown in FIG. 19. The state of connection between circuit cells is determined according to whether or not vias are formed in these jumper interconnects.

According to the interconnect structure shown in FIG. 19, when correction of the circuit becomes necessary, only the mask of the vias formed between the a-th layer and the (a+1)-th layer need be redone, therefore, the cost required for the correction may be kept small. However, the point that two vias are necessary for connection between circuit cells is the same as that of the interconnect structure shown in FIG. 17, so an increase of the signal delay cannot be avoided. Further, the jumper interconnects are newly added to the a-th layer and the (a+1)-th layer; therefore, two interconnects in the vertical direction and two in the horizontal direction, which could be used in the interconnect structure shown in FIG. 17, become unusable for each circuit cell. Namely, as indicated by the dotted line arrows in FIG. 19, wasteful unusable interconnect tracks are formed, so there is the problem of reduction of the interconnect resources.

SUMMARY OF THE INVENTION

It is, therefore, desirable to provide a semiconductor integrated circuit able to decrease the number of vias inserted in an interconnect route.

According to the present invention, there is provided a semiconductor integrated circuit comprising a plurality of interconnect layers; and at least one via connecting interconnects of two adjacent interconnect layers, wherein each interconnect layer has a plurality of first interconnect groups and a plurality of second interconnect groups arranged in a matrix. Each first interconnect group includes a plurality of first interconnects extending in a row direction of the matrix and arranged side by side in a column direction of the matrix, while each second interconnect group includes a plurality of second interconnects extending in the column direction and arranged side by side in the row direction. The first interconnect groups and the second interconnect groups are alternately arranged in each row and in each column of the matrix. The first interconnect groups and the second interconnect groups are further arranged facing each other between two adjacent interconnect layers. The first interconnect groups and the second interconnect groups facing each other between the layers have crossing parts where they can be connected through vias. Each first interconnect group and the first interconnect groups adjacent in the row direction to the second interconnect group facing that first interconnect group between layers have overlapping parts where they can be connected through vias. Each second interconnect group and the second interconnect groups adjacent in the column direction to the first interconnect group facing that second interconnect group between layers have overlapping parts where they can be connected through vias.

The plurality of interconnect layers may include an adjacent first interconnect layer and second interconnect layer. Each of the first interconnect groups included in the first interconnect layer and the second interconnect layer may further have at least one third interconnect sandwiched between two predetermined first interconnects and extending in the column direction. Each of the second interconnect groups included in the first interconnect layer and the second interconnect layer may include a second interconnect divided into at least two segments. Each third interconnect formed in one of the first interconnect layer and the second interconnect layer and two segments of a second interconnect formed in the other may have overlapping parts where they can be connected through vias.

At least a part of the first interconnects included in the first interconnect groups belonging to the same column of the matrix may have at least one of the two ends thereof aligned in the column direction. At least a part of the second interconnects included in the second interconnect groups belonging to the same row of the matrix may have at least one of the two ends thereof aligned in the row direction.

At least part of the first interconnects included in the first interconnect groups belonging to the same column of the matrix and having ends aligned in the column direction may have common lengths. At least part of the second interconnects included in the second interconnect groups belonging to the same row of the matrix and having ends aligned in the row direction may have common lengths.

The first interconnect groups belonging to the same row of the matrix may include equal numbers of first interconnects. The second interconnect groups belonging to the same column of the matrix may include equal numbers of second interconnects.

The present invention may have a plurality of circuit cells arranged in the row direction and the column direction of the matrix.

According to the present invention, therefore, the number of vias inserted in the interconnect route can be decreased; therefore, the signal delay can be reduced.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, embodiments of the present invention will be explained with reference to the drawings.

Figure 1:
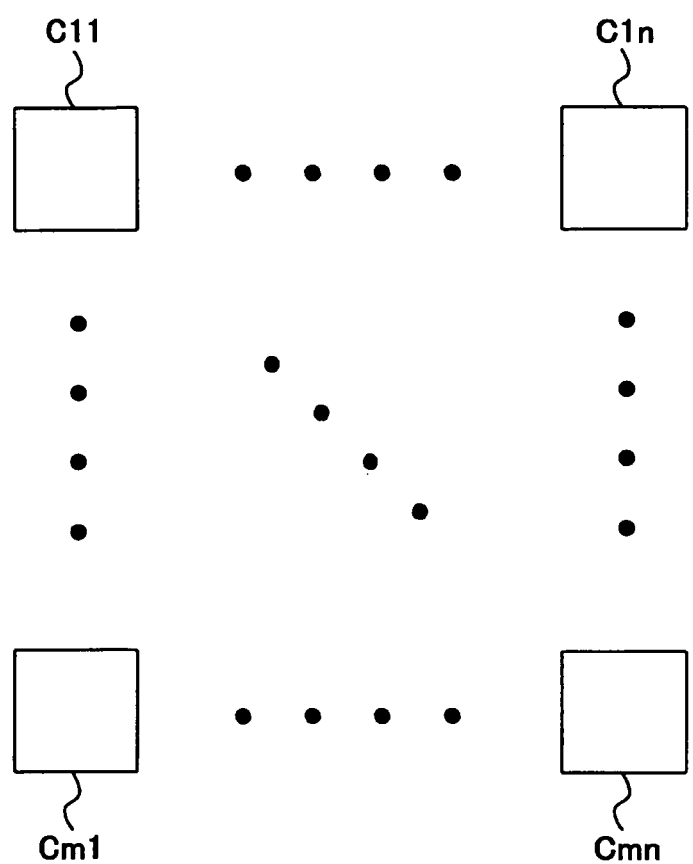
FIG. 1 is a view of an example of the configuration of a semiconductor integrated circuit according to an embodiment of the present invention.

FIG. 1 is a view of an example of the configuration of a semiconductor integrated circuit according to an embodiment of the present invention. The semiconductor integrated circuit shown in FIG. 1 has m×n number of circuit cells C11 to Cmn (m and n indicate any natural numbers larger than 1). These circuit cells C11 to Cmn are arranged in a matrix consisting of, for example, m number of rows and n number of columns, as shown in FIG. 1.

Each circuit cell may be a basic gate like that of a NAND circuit or may have a structure smaller in size than that. In the latter case, each circuit cell may be programmed for logical function independent of the others. Each circuit cell is programmed for logical function by forming, for example, an independent program use interconnect (via etc.) for each circuit cell. An example of the configuration of the circuit cell will be explained later with reference to FIG. 12.

Figure 2:
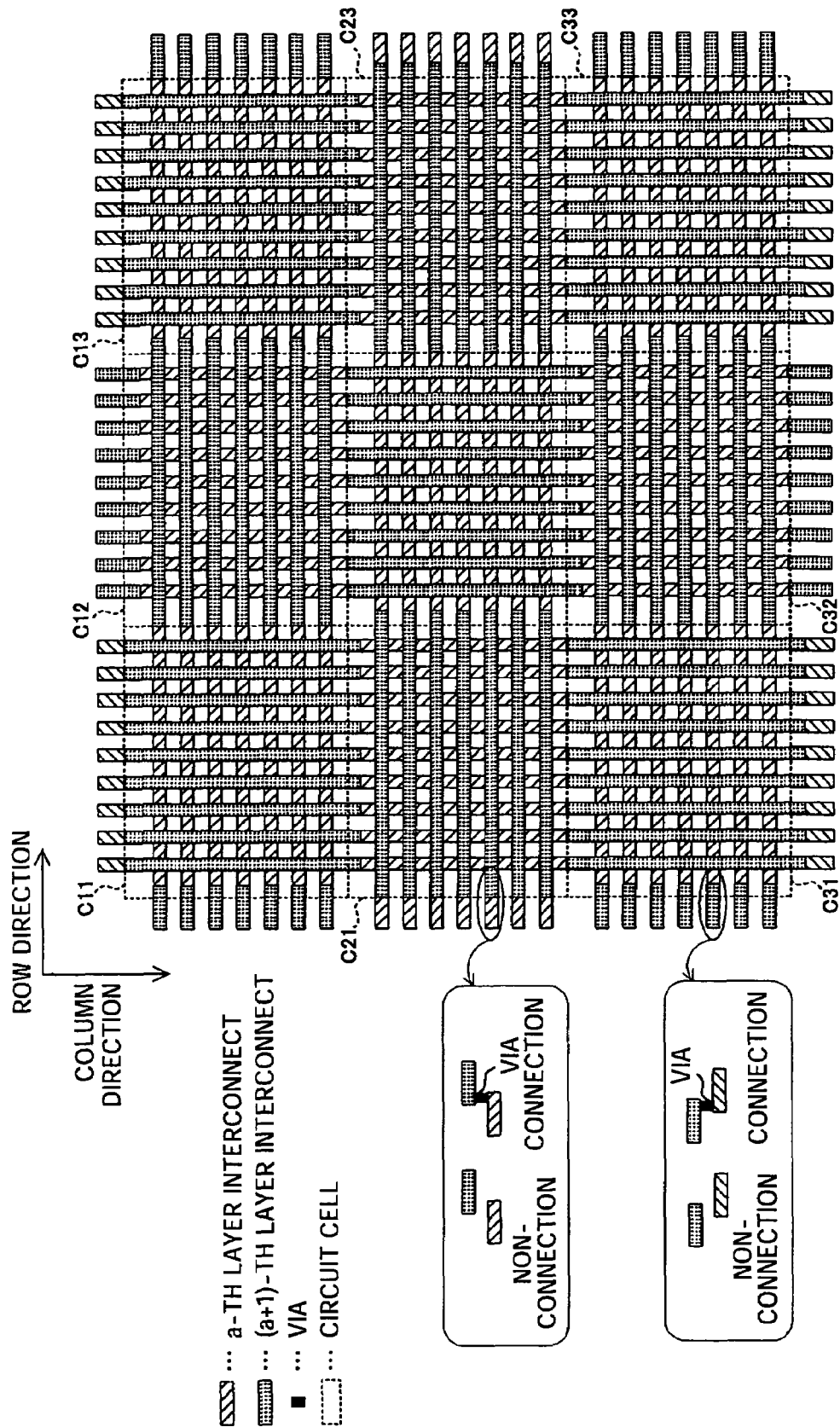
FIG. 2 is a view of a first example of an interconnect structure in a semiconductor integrated circuit according to the present embodiment.
Figure 3:
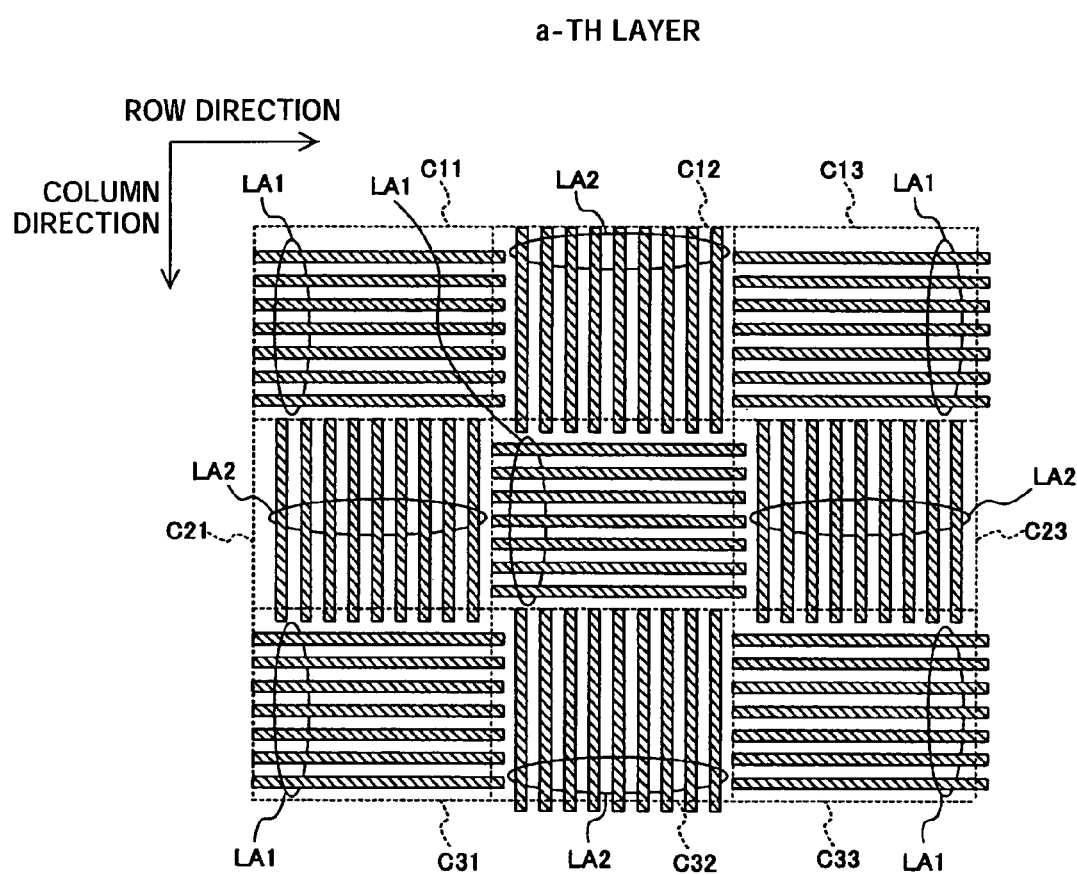
FIG. 3 shows an example of an interconnect pattern of an a-th layer in the interconnect structure shown in FIG. 2.
Figure 4:
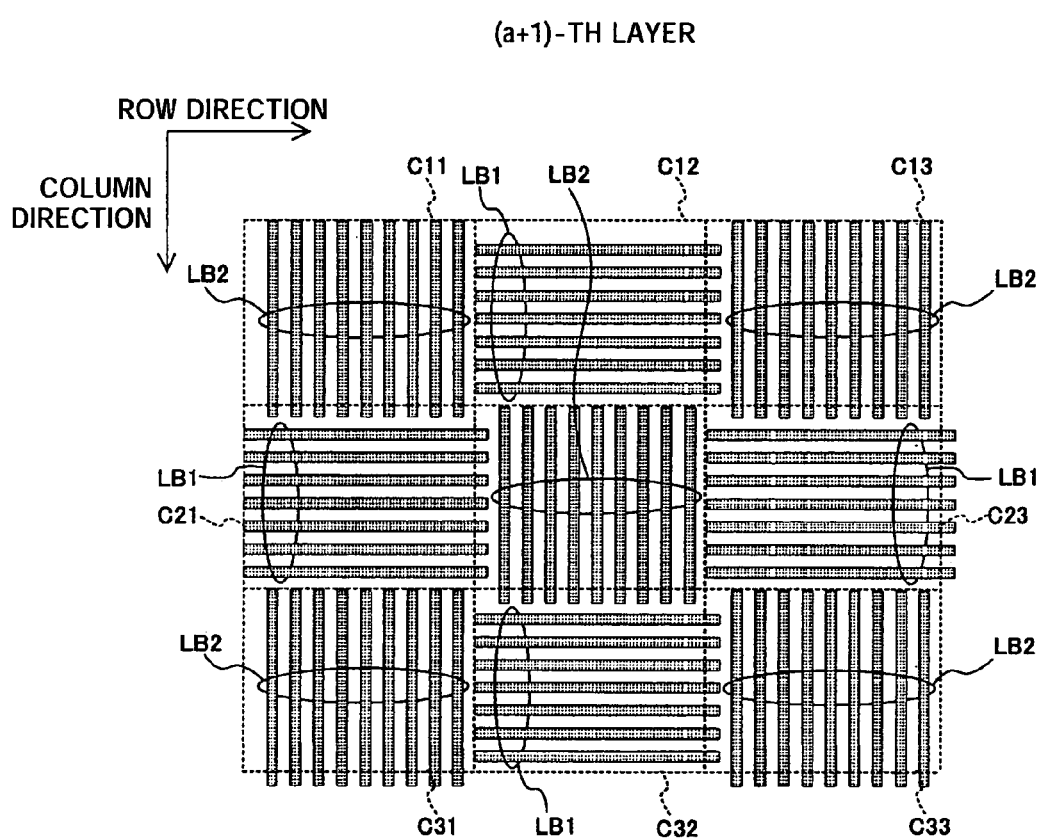
FIG. 4 shows an example of the interconnect pattern of an (a+1)-th layer in the interconnect structure shown in FIG. 2.

FIG. 2 is a view of a first example of an interconnect structure in a semiconductor integrated circuit according to the present embodiment and shows interconnect patterns in the a-th layer (a indicates any natural number) and the (a+1)-th layer just above the a-th layer. Further, FIG. 3 shows an example of the interconnect pattern of the a-th layer in the interconnect structure shown in FIG. 2. FIG. 4 shows an example of the interconnect pattern of the (a+1)-th layer in the interconnect structure shown in FIG. 2.

The a-th interconnect layer, for example, as shown in FIG. 3, has, for example, a plurality of interconnect groups LA1 and LA2 arranged in a matrix in the same way as the circuit cells C11 to Cmn. The interconnect group LA1 is an embodiment of a first interconnect group of the present invention. The interconnect group LA2 is an embodiment of a second interconnect group of the present invention.

Each interconnect group LA1 includes seven interconnects extending in the row direction. These seven interconnects are arranged side by side in the column direction. In the example of FIG. 3, these interconnects have a common length and have ends aligned in the column direction. Further, the interconnects of each interconnect group LA1 extend over one circuit cell to the adjacent circuit cell (right side of the figure).

Each interconnect group LA2 includes nine interconnects extending in the column direction. These nine interconnects are arranged side by side in the row direction. In the example of FIG. 3, these interconnects have a common length and have ends aligned in the row direction. Further, the interconnects of each interconnect group LA2 extend over one circuit cell to the adjacent circuit cell (lower side in the figure).

The interconnect groups LA1 and LA2 are alternately arranged in each row and each column of the matrix of the circuit cells. Namely, a lattice pattern comprised of the interconnect groups LA1 and LA2, as shown in FIG. 3, is formed in the a-th layer. Further, in the example of FIG. 3, the interconnect groups LA1 and LA2 are mainly formed in the regions of the circuit cells C11 to Cmn in the a-th layer.

The (a+1)-th interconnect layer, for example, as shown in FIG. 4, has a plurality of interconnect groups LB1 and LB2 arranged in a matrix in the same way as the circuit cells C11 to Cmn. The interconnect group LB1 is an embodiment of a first interconnect group of the present invention. The interconnect group LB2 is an embodiment of a second interconnect group of the present invention.

Each interconnect group LB1 includes seven interconnects extending in the row direction. These seven interconnects are arranged side by side in the column direction. In the example of FIG. 4, these interconnects have a common length and have ends aligned in the column direction. Further, the interconnects of each interconnect group LB1 extend over one circuit cell to the adjacent circuit cell (right side of the figure).

Each interconnect group LB2 includes nine interconnects extending in the column direction. These nine interconnects are arranged side by side in the row direction. In the example of FIG. 4, these interconnects have a common length and have ends aligned in the row direction. Further, the interconnects of each interconnect group LB2 extend over one circuit cell to the adjacent circuit cell (lower side in the figure).

The interconnect groups LB1 and LB2 are alternately arranged in each row and each column of the matrix of the circuit cell. Namely, a lattice pattern comprised of the interconnect groups LB1 and LB2, as shown in FIG. 4, is formed in the (a+1)-th layer. Further, in the example of FIG. 4, the interconnect groups LB1 and LB2 are mainly formed in the regions of the circuit cells C11 to Cmn in the (a+1)-th layer.

An interconnect group LA1 and interconnect group LB2 and an interconnect group LA2 and interconnect group LB1 are arranged facing each other between the a-th layer and the (a+1)-th layer. For example, in the region of the circuit cell C11, an interconnect group LA1 and interconnect group LB2 are arranged facing each other, while in the region of the circuit cell C21, an interconnect group LA2 and interconnect group LB1 are arranged facing each other.

Each interconnect group LA1 and interconnect group LB2 facing each other between layers have crossing parts between the layers. Vias can be formed at these crossing parts. In the same way, each interconnect group LA2 and interconnect group LB1 facing each other between layers have crossing parts where they can be connected through vias. As shown in FIG. 2, by crossing the vertical seven interconnect groups and nine interconnect groups between layers, 63 crossing parts are formed. Vias passing through the a-th layer and the (a+1)-th layer are selectively formed at the crossing parts in accordance with the circuit configuration. When forming a via at a crossing part, the crossing interconnects between the layers are connected to each other. By forming vias at the crossing part of an interconnect group LA1 and interconnect group LB2 and at the crossing part of an interconnect group LA2 and the interconnect group LB1, the interconnect route can be bent.

Further, the seven interconnects of each interconnect group LA1 have parts overlapping with the seven interconnects of the interconnect groups LB1 adjacent in the row direction to the interconnect group LB2 facing that interconnect group LA1. Vias can be formed at these overlapping parts. For example, the seven interconnects of the interconnect group LA1 formed at the region of the circuit cell C12 have parts overlapping with the seven interconnects of the interconnect groups LB1 formed in the region of the circuit cell C11 and the circuit cell C13. Vias passing through the a-th layer and the (a+1)-th layer are selectively formed at the overlapping parts in accordance with the circuit configuration. When forming a via at an overlapping part, the overlapping interconnects between the layers are connected to each other. By forming a via at overlapping parts of the interconnect group LA1 and interconnect group LB1, a long interconnect extending in the row direction can be formed.

Further, the nine interconnects of the interconnect group LA2 have parts overlapping with the nine interconnects of the interconnect groups LB1 adjacent in the column direction to the interconnect group LB1 facing this interconnect group LA2. Vias can be formed at these overlapping parts. For example, the nine interconnects of the interconnect group LA2 formed at the region of the circuit cell C21 have parts overlapping with the nine interconnects of the interconnect groups LB2 formed at the regions of the circuit cell C11 and the circuit cell C31. Vias passing through the a-th layer and the (a+1)-th layer are selectively formed at these overlapping parts in accordance with the circuit configuration. When forming a via at an overlapping part, the overlapping interconnects between layers are connected to each other. By forming a via at overlapping parts of the interconnect group LA2 and interconnect group LB2, a long interconnect extending in the column direction can be formed.

Figure 5:
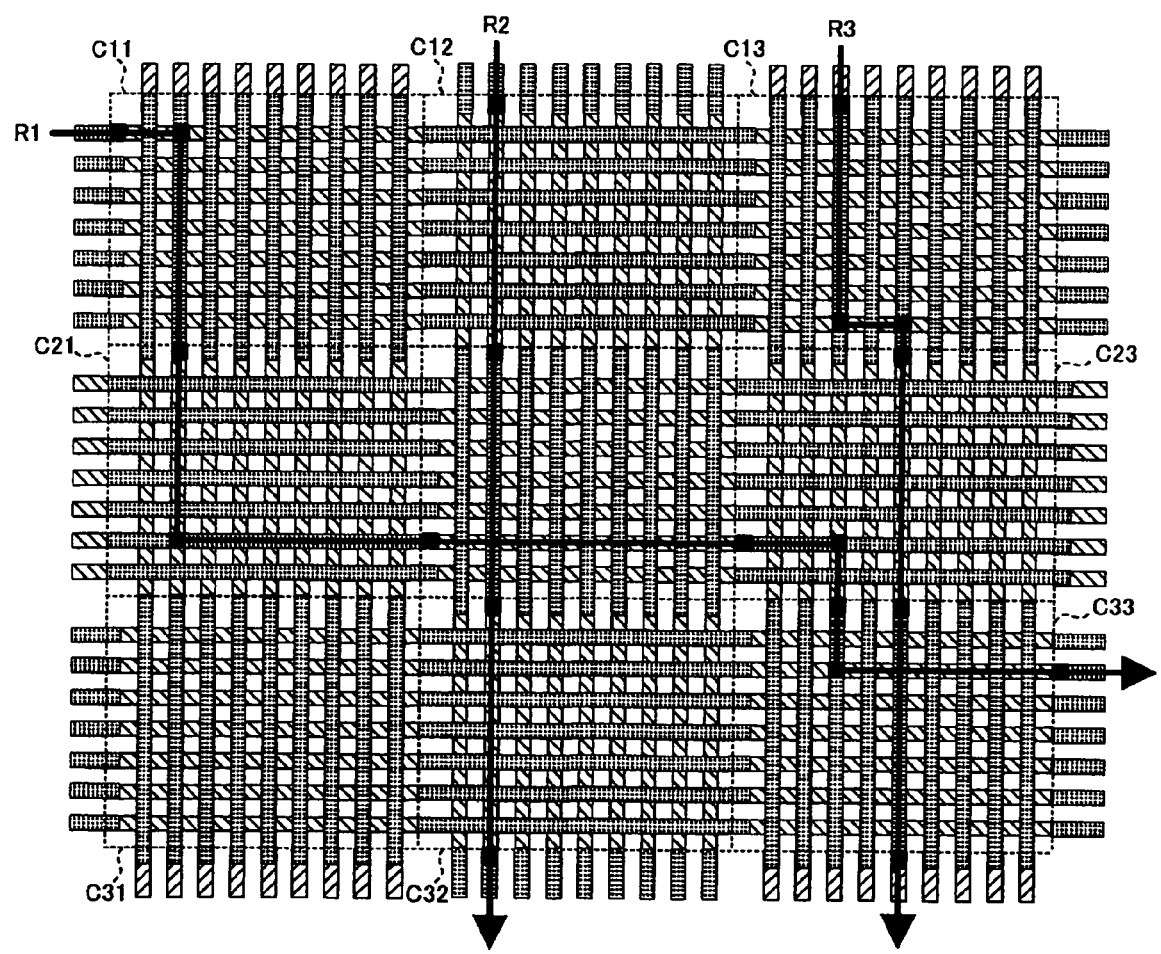
FIG. 5 is a view of an example of forming a specific interconnect route by using the interconnect structure shown in FIG. 2.

FIG. 5 is a view of an example of forming a specific interconnect route using the interconnect structure shown in FIG. 2. An interconnect route R1 in FIG. 5 forms a pattern equivalent to an interconnect route R10 in FIG. 17. In contrast to the interconnect route R10 using 14 vias, the number of vias becomes 10 in the interconnect route R1, i.e., the route is reduced by four vias. An interconnect route R2 in FIG. 5 forms a pattern equivalent to an interconnect route R11 in FIG. 17. In contrast to the interconnect route R11 using six vias, the number of vias becomes four in the interconnect route R2, i.e., the route is reduced by two vias.

Figure 17:
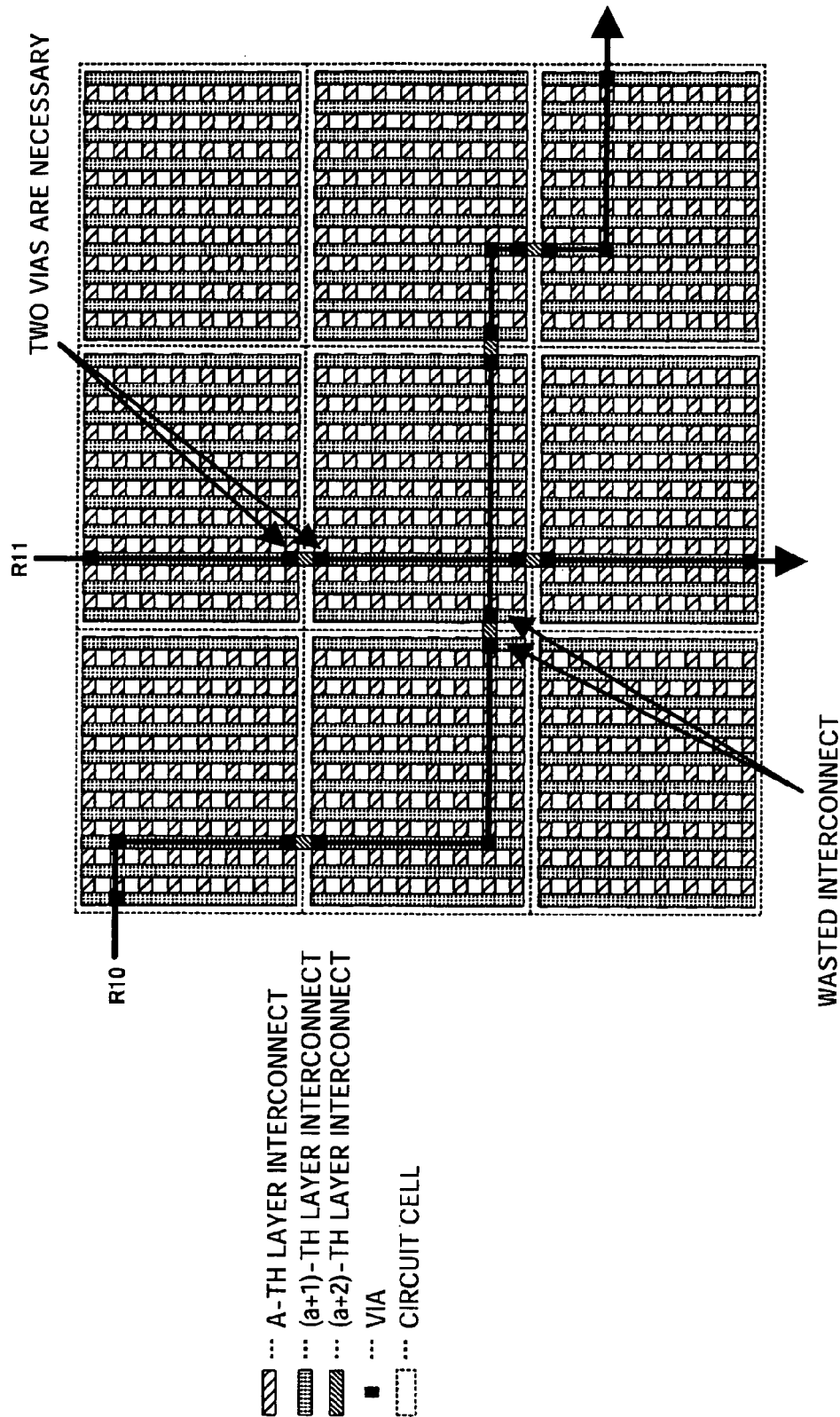
FIG. 17 is a first example showing an example of the interconnect structure used in a structured ASIC.
Figure 18:
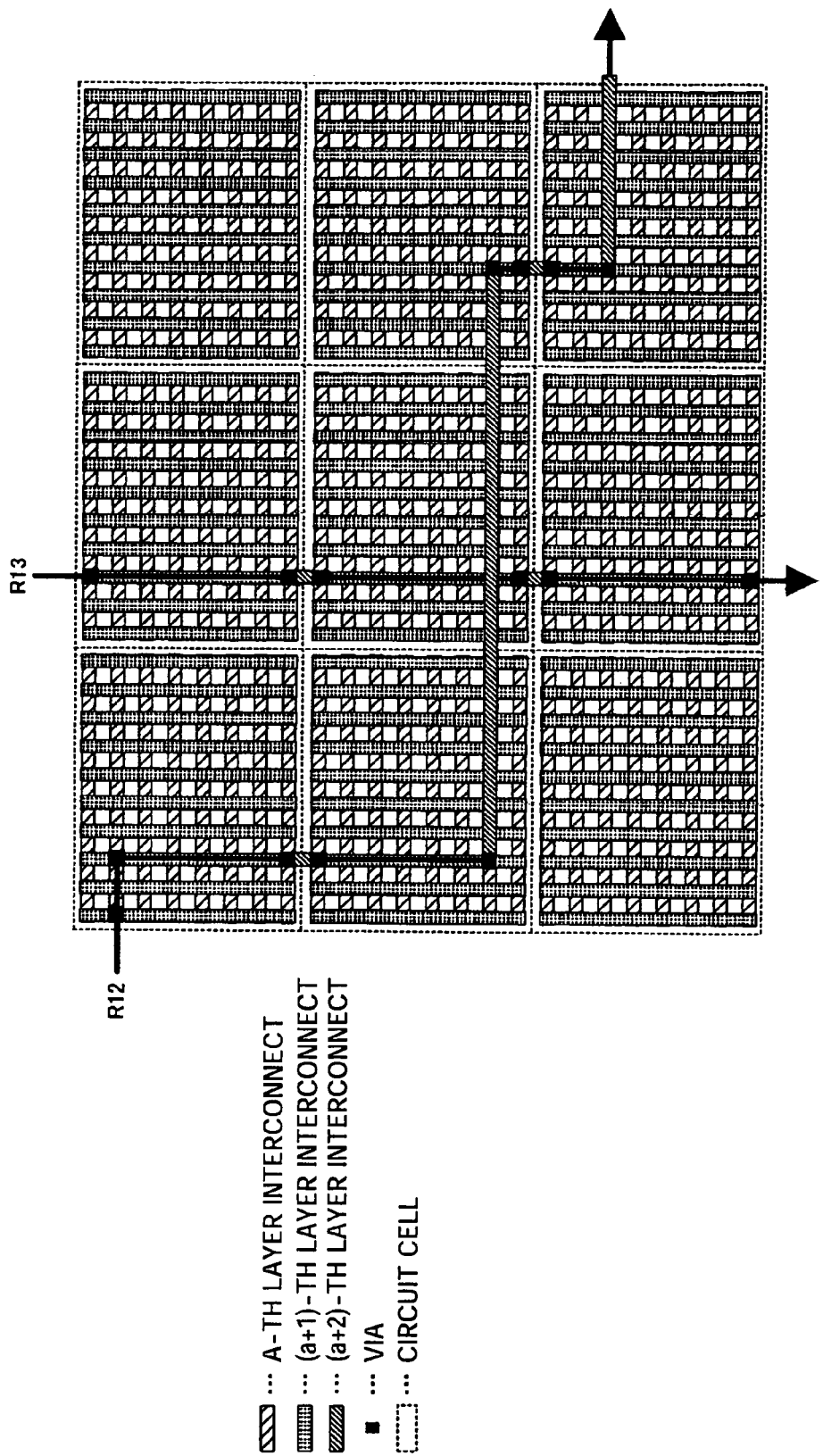
FIG. 18 is a second example showing an example of the interconnect structure used in a structured ASIC.
Figure 19:
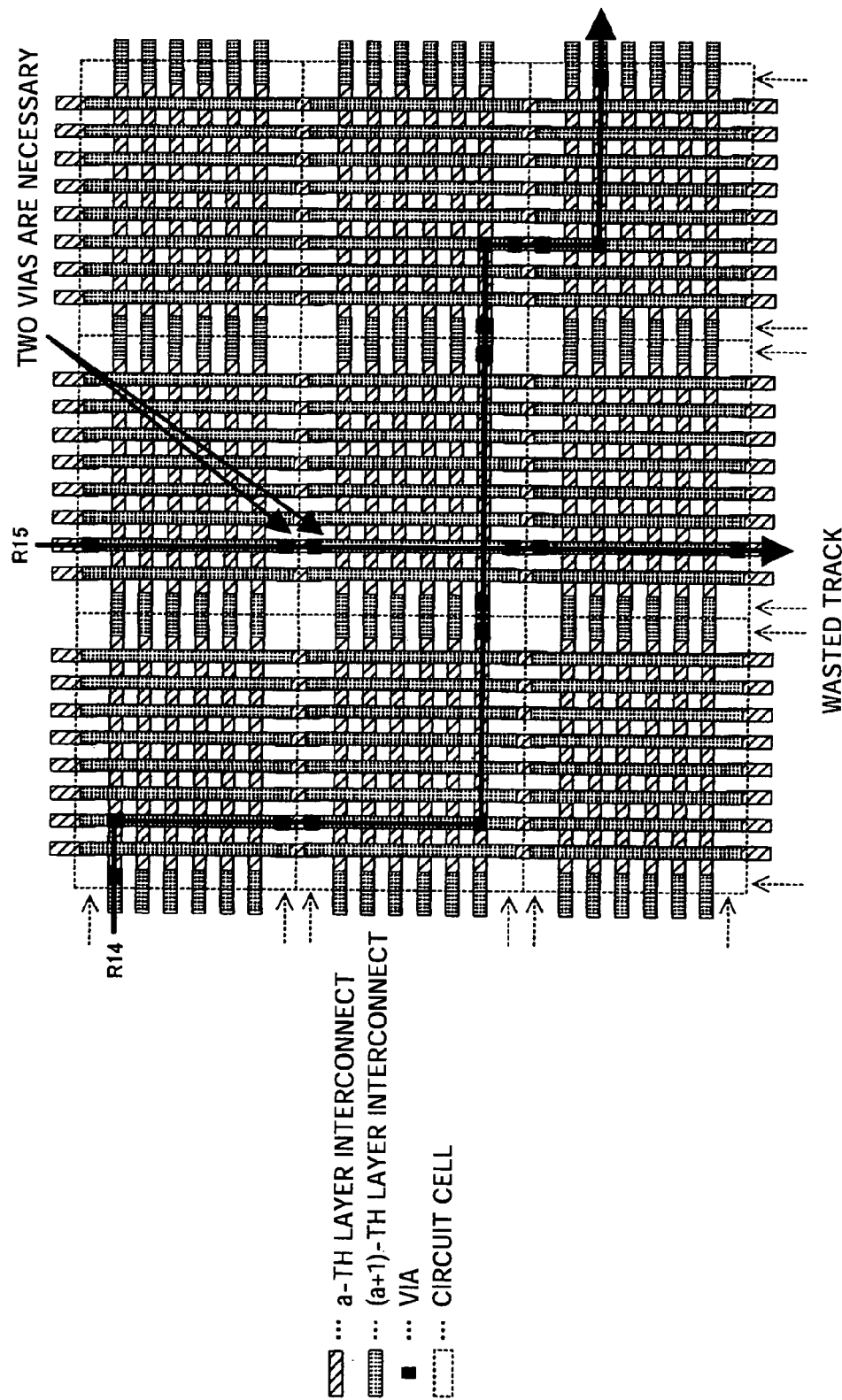
FIG. 19 is a third example showing an example of the interconnect structure used in a structured ASIC.

In this way, according to the interconnect structure shown in FIG. 2 to FIG. 4, by forming one via at the overlapping parts of the interconnect groups LA1 and LB1 or the overlapping parts of the interconnect groups LA2 and LB2, the interconnect route can be extended in the row direction or the column direction by exactly a length of one interconnect group. For this reason, in comparison with the interconnect structure requiring two vias for extending the interconnect route in the row direction or the column direction, as shown in FIG. 17 and FIG. 19, the number of vias inserted in the interconnect route can be decreased. If the number of vias is decreased, the impedance of the interconnect route becomes smaller; therefore, the signal delay is reduced, and the operation speed can be raised.

Further, in the interconnect structure shown in FIG. 17, a via is formed in the interconnect extending in a direction perpendicular with respect to the interconnect route in order to extend the interconnect route in the row direction or the column direction; therefore, there is a problem that the parasitic capacitance increases due to this excessive interconnect. On the other hand, according to the interconnect structure shown in FIG. 2 to FIG. 4, such an excessive interconnect does not exist when extending the interconnect route in the row direction or the column direction; therefore, the parasitic capacitance becomes smaller in comparison with the interconnect structure shown in FIG. 17. Accordingly, also from this point, the operation speed can be raised in comparison with the conventional interconnect structure.

Further, in the interconnect structure shown in FIG. 2 to FIG. 4, the two ends of the interconnects (first interconnects) included in the interconnect group LA1 and the interconnect group LB1 belonging to the same column are aligned in the column direction; therefore, overlapping parts of the interconnect group LA1 and the interconnect group LB1 belonging to two adjacent columns are aligned in a straight line in the column direction. A via formed in these overlapping parts occupies one interconnect track in the column direction. Further, in the interconnect structure shown in FIG. 2 to FIG. 4, the two ends of the interconnects (second interconnects) included in the interconnect group LA2 and the interconnect group LB2 belonging to the same row are aligned in the row direction; therefore, overlapping parts of the interconnect group LA2 and the interconnect group LB2 belonging to two adjacent rows are aligned in a straight line in the row direction. A via formed in these overlapping parts occupies one interconnect track in the row direction. Accordingly, according to the interconnect structure shown in FIG. 2 to FIG. 4, in comparison with the interconnect structure shown in FIG. 19 in which two interconnect tracks are occupied in each row and each column due to an interconnect bridging circuit cells, the number of wasted interconnect tracks is decreased, and the interconnect resources can be increased. When the interconnect resources increase, it becomes possible to lay a larger number of interconnects in the same circuit area, and the degree of integration of the circuit can be raised.

Next, a second example of an interconnect structure in a semiconductor integrated circuit according to the present embodiment will be explained with reference to FIG. 6 and FIG. 7.

Figure 6:
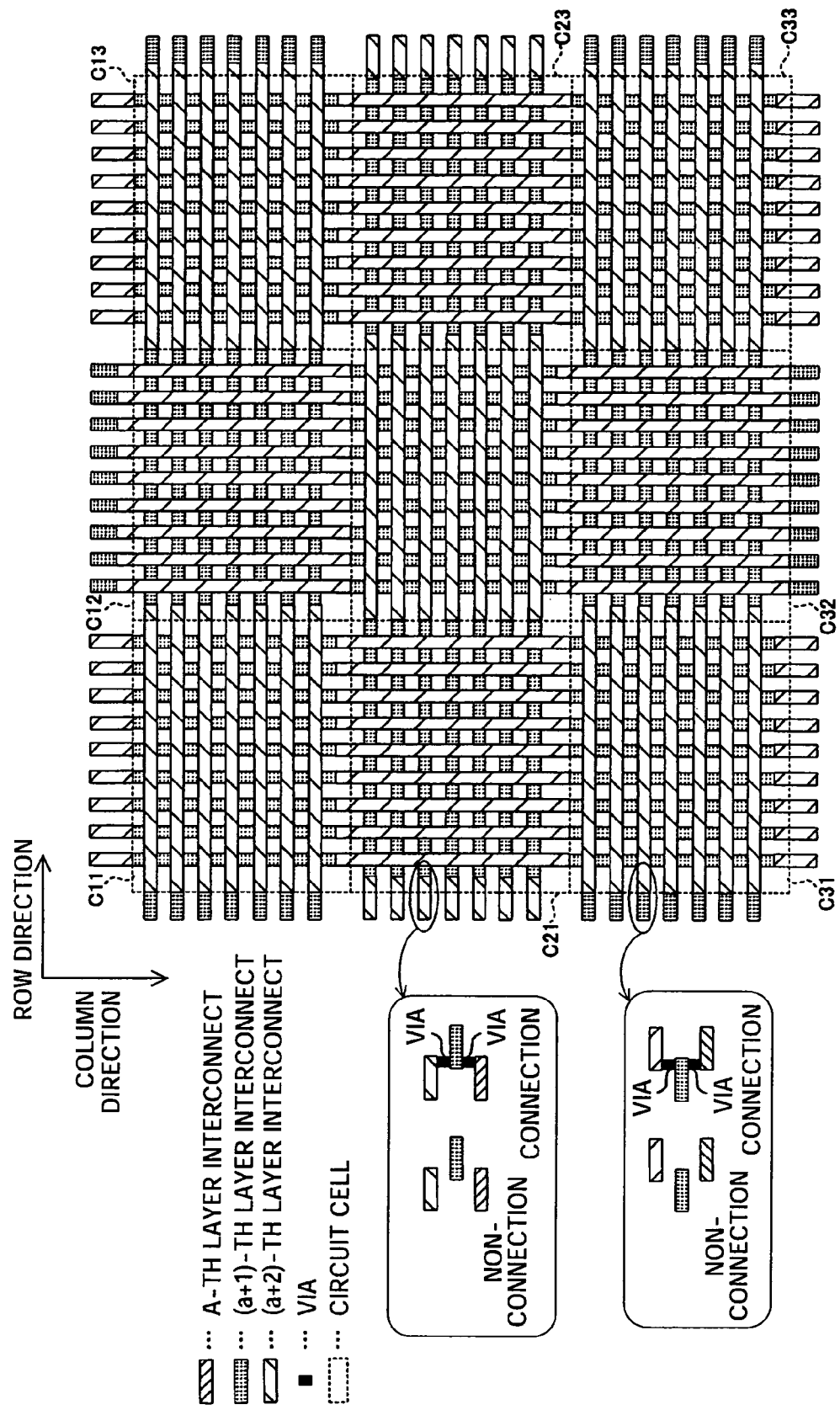
FIG. 6 is a view of a second example of an interconnect structure in a semiconductor integrated circuit according to the present embodiment.

In the semiconductor integrated circuit shown in FIG. 6, interconnects having the same patterns as the a-th layer are formed in the layer ((a+2)-th layer) further above the (a+1)-th layer in the semiconductor integrated circuit shown in FIG. 2. FIG. 7 is a view of an example of the interconnect patterns of the (a+2)-th layer.

Figure 7:
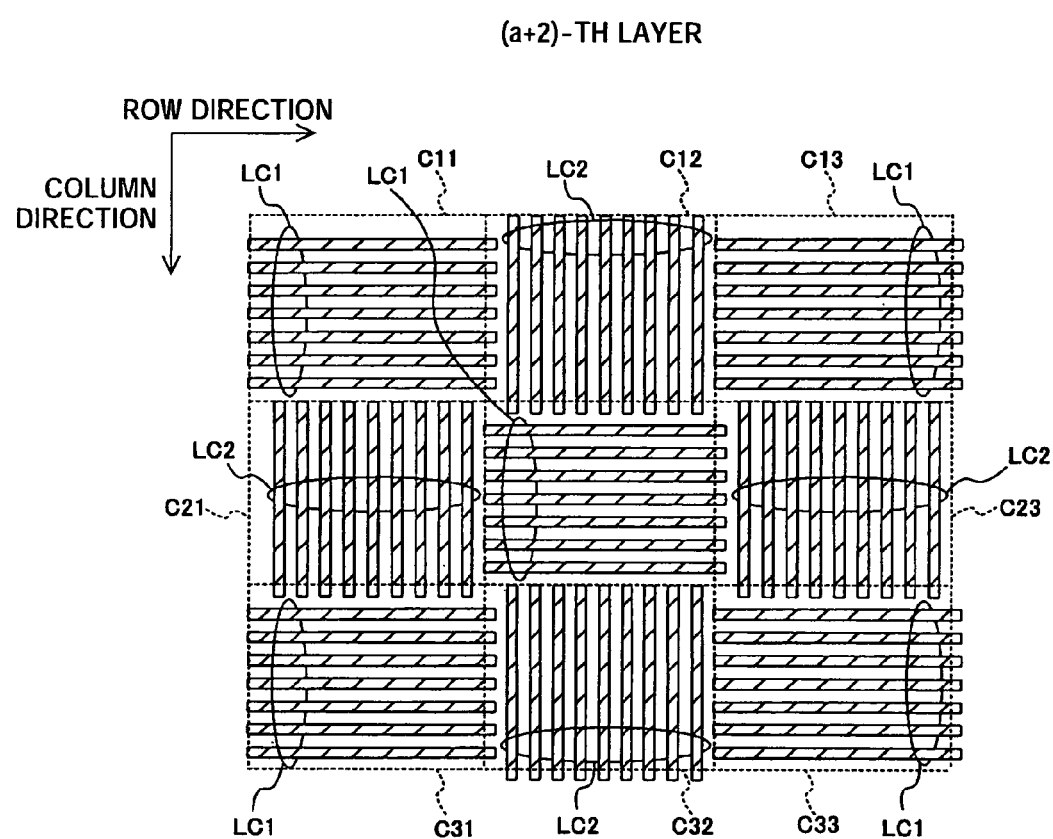
FIG. 7 is a view of an example of the interconnect pattern of an (a+2)-th layer in the interconnect structure shown in FIG. 6.

The (a+2)-th interconnect layer has, for example, a plurality of interconnect groups LC1 and LC2 arranged in a matrix in the same way as the circuit cells C11 to Cmn shown in FIG. 7. The interconnect group LC1 is an embodiment of a first interconnect group of the present invention. The interconnect group LC2 is an embodiment of a second interconnect group of the present invention.

Each interconnect group LC1 includes seven interconnects extending in the row direction. These seven interconnects are arranged side by side in the column direction. In the example of FIG. 7, these interconnects have a common length and have ends aligned in the column direction. Further, the interconnects of the interconnect group LC1 extend over one circuit cell to the adjacent circuit cell (right side of the figure).

Each interconnect group LC2 includes nine interconnects extending in the column direction. These nine interconnects are arranged side by side in the row direction. In the example of FIG. 7, these interconnects have a common length and have ends aligned in the row direction. Further, the interconnects of the interconnect group LC2 extend over one circuit cell to the adjacent circuit cell (lower side in the figure).

The interconnect groups LC1 and LC2 are alternately arranged in each row and each column of the matrix. Namely, as shown in FIG. 7, a lattice pattern comprised of the interconnect groups LC1 and LC2 is formed in the (a+2)-th layer. Further, in the example of FIG. 7, the interconnect groups LC1 or LC2 are mainly formed in the regions of the circuit cells C11 to Cmn in the (a+2)-th layer.

Each interconnect group LC1 and interconnect group LB2 and each interconnect group LC2 and interconnect group LB1 are arranged facing each other between the (a+1)-th layer and the (a+2)-th layer. For example, in the region of the circuit cell C11, an interconnect group LC1 and interconnect group LB2 are arranged facing each other, while in the region of the circuit cell C21, an interconnect group LC2 and interconnect group LB1 are arranged facing each other.

Each interconnect group LC1 and interconnect group LB2 facing each other between layers have crossing parts between the layers. Vias can be formed at the crossing parts. In the same way, each interconnect group LC2 and interconnect group LB1, facing each other between layers, have crossing parts where they can be connected through vias. By forming vias in the crossing parts of the interconnect group LC1 and the interconnect group LB2 and the crossing parts of the interconnect group LC2 and the interconnect group LB1, the interconnect route can be bent.

Further, the seven interconnects of the interconnect group LC1 have parts overlapping with the seven interconnects of the interconnect groups LB1 adjacent in the row direction to the interconnect group LB2 facing the interconnect group LB1. Vias can be formed at these overlapping parts. For example, the seven interconnects of the interconnect group LC1 formed in the region of the circuit cell C12 have parts overlapping with the interconnects of the interconnect groups LB1 formed in the regions of the circuit cell C11 and the circuit cell C13. Vias passing through the (a+1)-th layer and the (a+2)-th layer are selectively formed at these overlapping parts in accordance with the circuit configuration. When forming a via at an overlapping part, interconnects overlapping with each other between layers are connected to each other. By forming a via at the overlapping parts of the interconnect group LC1 and the interconnect group LB1, a long interconnect extending in the row direction can be formed.

Further, the nine interconnects of the interconnect group LC2 have parts overlapping with the nine interconnects of the interconnect groups LB2 adjacent in the column direction to the interconnect group LB1 facing this interconnect group LC2. Vias can be formed at these overlapping parts. For example, the nine interconnects of the interconnect group LC2 formed in the region of the circuit cell C21 have parts overlapping with the nine interconnects of the interconnect groups LB2 formed in the regions of the circuit cell C11 and the circuit cell C31. Vias passing through the (a+1)-th layer and the (a+2)-th layer are selectively formed at these overlapping parts in accordance with the circuit configuration. When forming a via at the overlapping parts, overlapping interconnects between layers are connected to each other. By forming a via at the overlapping parts of the interconnect group LC2 and the interconnect group LB2, a long interconnect extending in the column direction can be formed.

As explained above, the interconnect structures of the a-th layer and the (a+1)-th layer are substantially equivalent to those of the (a+1)-th layer and the (a+2)-th layer. For this reason, by adding the interconnect patterns shown in FIG. 7 to the (a+2)-th layer, effects the same as those by the interconnect structure shown in FIG. 2 (the number of vias can be decreased, the interconnect resources can be increased, etc.) are also realized in the interconnect structures of the (a+1)-th layer and the (a+2)-th layer. Further, by adding interconnect layers, the interconnect resources increase more than the interconnect structure shown in FIG. 2; therefore, the degree of integration of the circuit can be further improved.

Next, a third example of an interconnect structure in a semiconductor integrated circuit according to the present embodiment will be explained with reference to FIG. 8.

Figure 8:
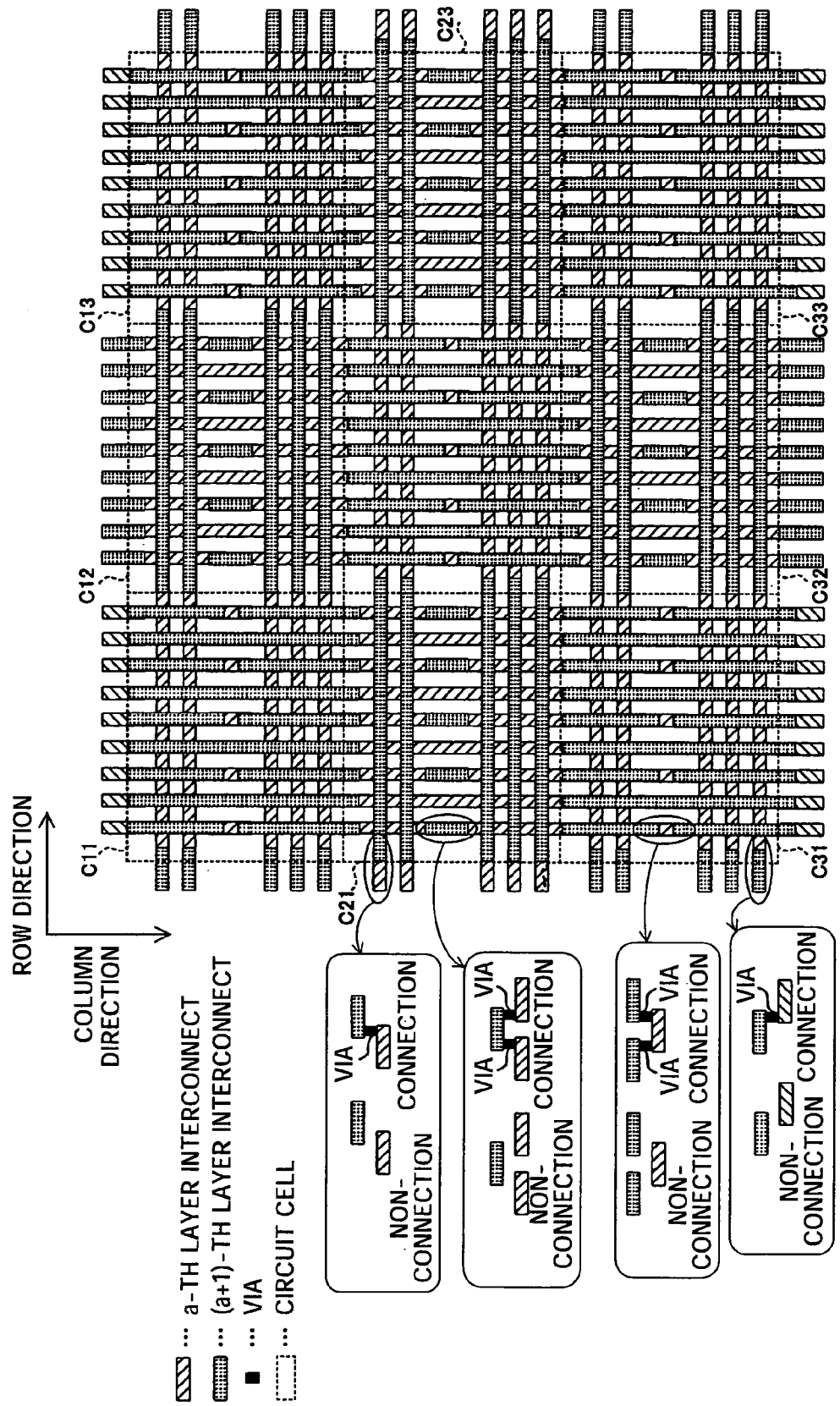
FIG. 8 is a view of a third example of an interconnect structure in a semiconductor integrated circuit according to the present embodiment.

In the interconnect structure shown in FIG. 8, part of the interconnects included in the interconnect groups extending in the column direction are divided into two segments. It is possible to control the connection of these divided segments according to presence of vias.

Figure 9:
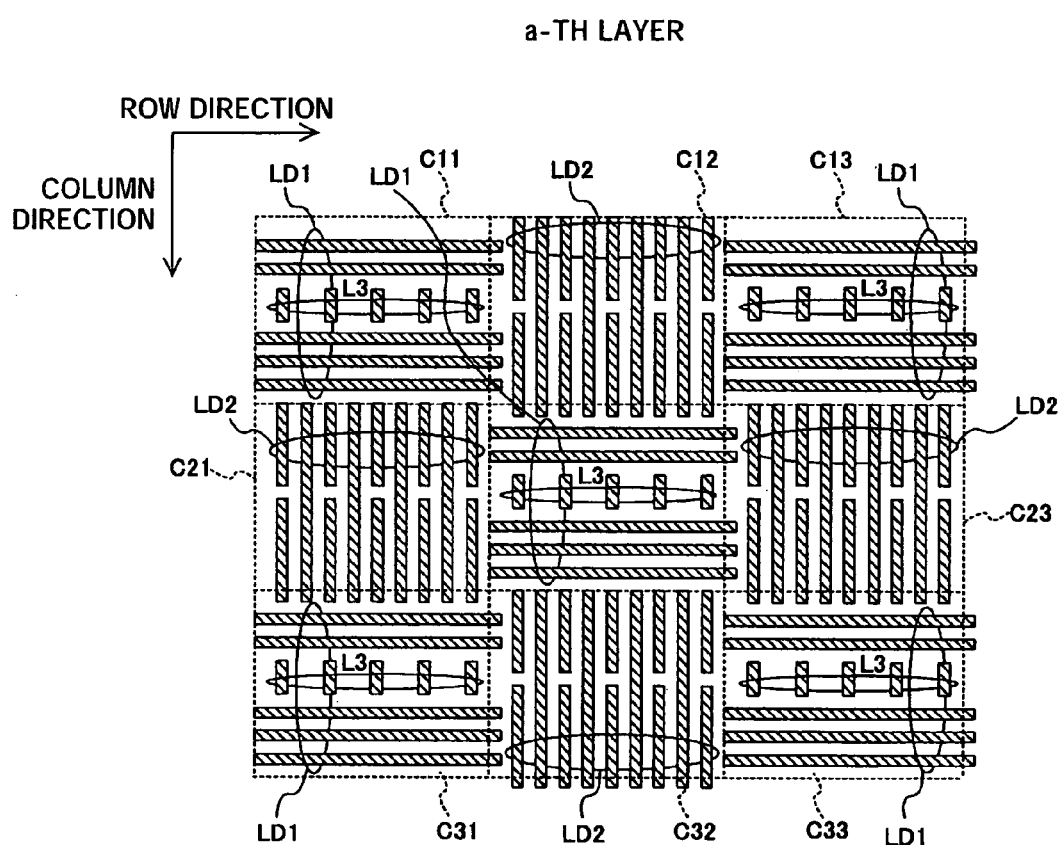
FIG. 9 shows an example of an interconnect pattern of the a-th layer in the interconnect structure shown in FIG. 8.
Figure 10:
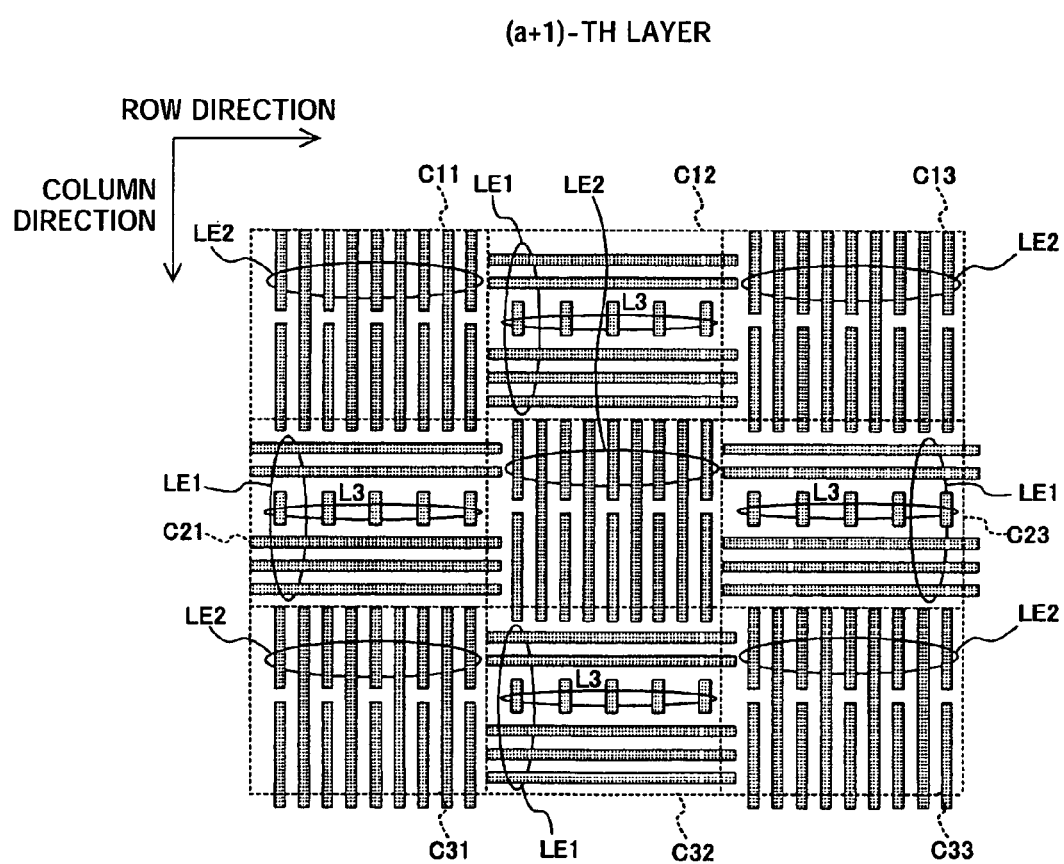
FIG. 10 shows an example of an interconnect pattern of the (a+1)-th layer in the interconnect structure shown in FIG. 8.

FIG. 9 shows an example of the interconnect patterns of the a-th layer in the interconnect structure shown in that FIG. 8, and FIG. 10 shows an example of the interconnect patterns of the (a+1)-th layer.

The a-th interconnect layer has, for example, a plurality of interconnect groups LD1 and LD2 arranged in a matrix in the same way as the circuit cells C11 to Cmn, as shown in FIG. 9. The interconnect group LD1 is an embodiment of a first interconnect group of the present invention. The interconnect group LD2 is an embodiment of a second interconnect group of the present invention.

In each interconnect group LD1, the third and fourth interconnects in the previously explained interconnect group LA1 are deleted, and five interconnects L3 corresponding to the third interconnect of the present invention are provided in place of them. The interconnects L3 are relatively short interconnects extending in the column direction and are arranged side by side in the row direction on the tracks in which the deleted third and fourth interconnects were formed.

In the interconnect group LD2, each of the first, third, fifth, seventh, and ninth interconnects in the previously explained interconnect group LA2 is divided into two segments near the center part thereof.

The (a+1)-th interconnect layer has, for example, a plurality of interconnect groups LE1 and LE2 arranged in a matrix in the same way as the circuit cells C11 to Cmn, as shown in FIG. 10. The interconnect group LE1 is an embodiment of a first interconnect group of the present invention. The interconnect group LE2 is an embodiment of a second interconnect group of the present invention.

In each interconnect group LE1, the third and fourth interconnects in the previously explained interconnect group LB1 are deleted, and five interconnects L3 corresponding to the third interconnect of the present invention are provided in place of them. The interconnects L3 are relatively short interconnects extending in the column direction and are arranged side by side in the row direction on the tracks in which the deleted third and fourth interconnects were formed.

In each interconnect group LE2, each of the first, third, fifth, seventh, and ninth interconnects in the previously explained interconnect group LB2 is divided into two segments near the center part thereof.

As will be understood from viewing FIG. 8 to FIG. 10, the two segments of the first, third, fifth, seventh, and ninth interconnects in each interconnect group LD2 have parts overlapping with the five interconnects L3 in the interconnect group LE1 facing this interconnect group LD2 between layers. Vias can be formed at the overlapping parts. By forming a via at the overlapping parts, two segments of an interconnect in the interconnect group LD2 are connected via the interconnect L3 in the interconnect group LE1.

Further, in the same way, the two segments of the first, third, fifth, seventh, and ninth interconnects in the interconnect group LE2 have parts overlapping with the five interconnects L3 in the interconnect group LD1 facing this interconnect group LE2 between layers. Vias can be formed at the overlapping parts. By forming a via at the overlapping parts, two segments of an interconnect in the interconnect group LE2 are connected via the interconnect L3 in the interconnect group LD1.

Figure 11:
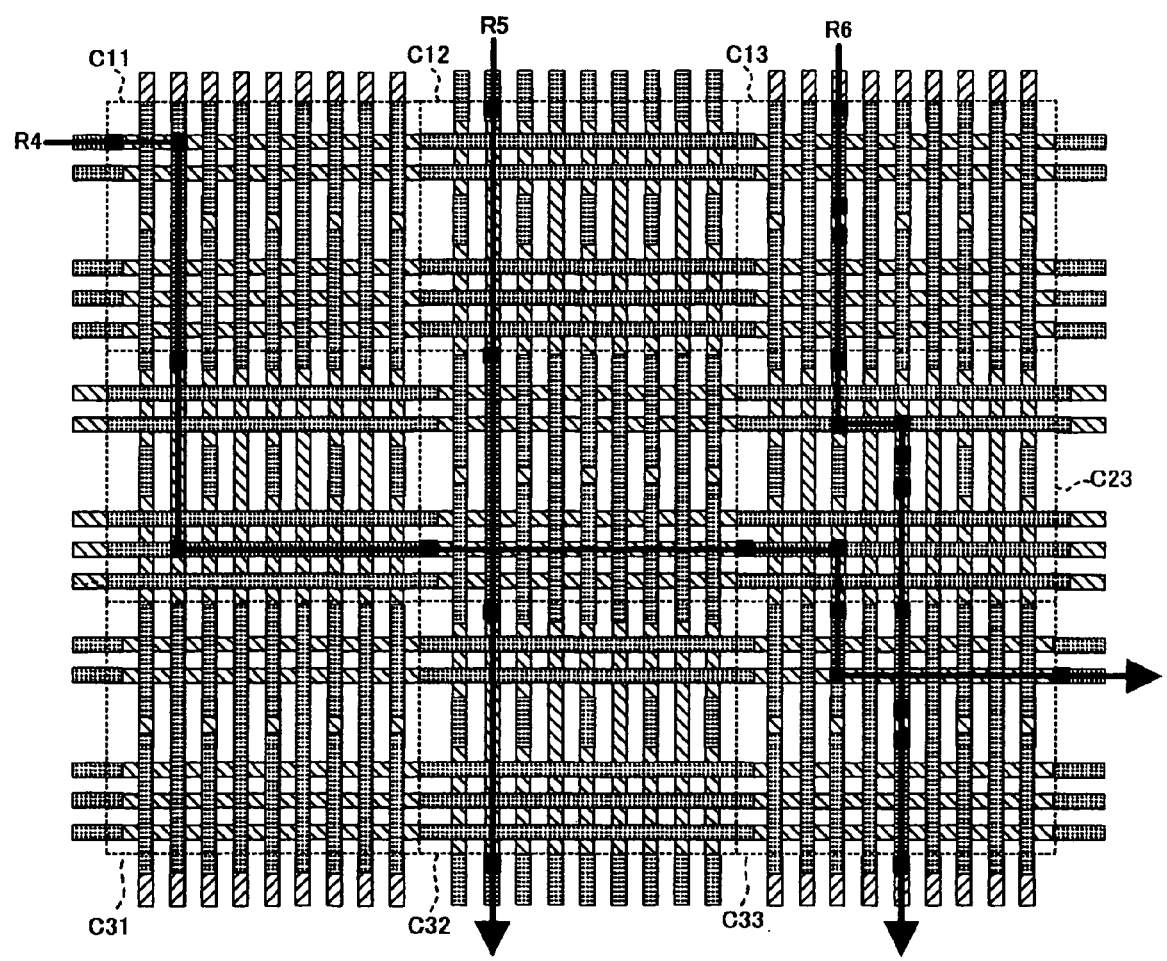
FIG. 11 is a view of an example of forming a specific interconnect route by using the interconnect structure shown in FIG. 8.

FIG. 11 is a view of an example of forming a specific interconnect route by using the interconnect structure shown in FIG. 8. The interconnect route R6 in FIG. 11 transmits a signal from the seventh interconnect (UE KARA KAZOETARA!!) in the column direction of the circuit cell C13 to the fifth interconnect in the column direction of the circuit cell C33 in the same way as the interconnect route R3 in the previously seen FIG. 5. The interconnect routes R4 and R5 in FIG. 11 form patterns the same as those of the interconnect routes R1 and R2 in the previously seen FIG. 5.

In the interconnect route R3 shown in FIG. 5, in order to avoid the interconnect route R1 passing through the circuit cell C23, the seventh interconnect in the column direction in the circuit cell C13 is used to jump from the third to the fifth interconnects in the column direction. As a result, the seventh interconnect in the row direction and the fifth interconnect in the column direction in the circuit cell C13 are occupied by the interconnect route R3. Contrary to this, in the interconnect route R6 shown in FIG. 11, the fact that the third interconnect in the column direction in the circuit cell C23 is divided into two segments is utilized to jump interconnects in the circuit cell C23. Namely, the second interconnect in the row direction in the circuit cell C23 is used to jump from the seventh interconnect to the fifth interconnect in the column direction. As a result, the seventh interconnect track in the column direction of the circuit cell C23 is shared by two interconnect routes (R4, R6). Accordingly, in the interconnect route R6 shown in FIG. 11, in comparison with the interconnect route R3 shown in FIG. 5, the number of interconnect tracks in the column direction used becomes smaller.

In this way, according to the interconnect structure shown in FIG. 8, part of the interconnects included in the interconnect groups (LD2, LE2) extending in the column direction are divided into two segments, and it is possible to control the connection of these divided segments according to presence of vias. For this reason, it becomes possible to independently jump interconnects by vias by using the divided segments, and the interconnect resources in the column direction can be increased. In the interconnect structure shown in FIG. 8, while the interconnects in the row direction are decreased from the interconnect structure shown in FIG. 2 and the interconnect resources thereof are reduced, the interconnect resources in the column direction are increased. This is particularly effective for an application stressing interconnect resources in the column direction.

Next, an example of the configuration of the circuit cells C11 to Cmn will be explained with reference to FIG. 12.

Figure 12:
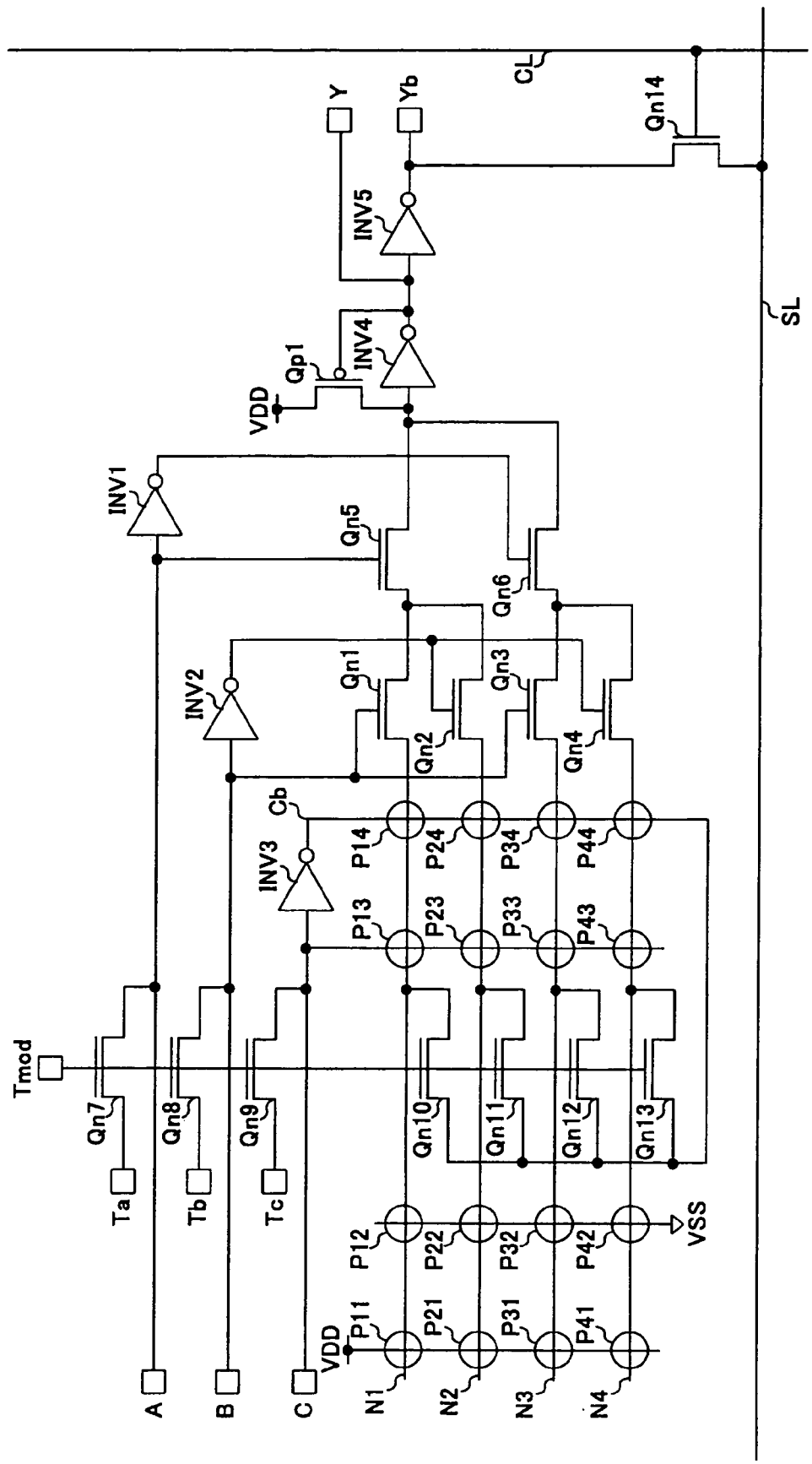
FIG. 12 is a view of an example of the configuration of a circuit cell of a semiconductor integrated circuit according to the present embodiment.

FIG. 12 is a view of an example of the configuration of a circuit cell of a semiconductor integrated circuit according to the present embodiment. The circuit cell shown in FIG. 12 has n-channel MOS type transistors Qn1 to Qn14, a p-channel MOS type transistor Qp1, and inverter circuits INV1 to INV5.

The transistors Qn1 to Qn6 and Qp1 and the inverter circuits INV1 to INV4 form a three-input LookUp Table using nodes A, B, and C as the inputs and using a node Y as the output.

A source of the transistor Qn1 is connected to a node N1, and its drain is connected via the transistor Qn5 to the input of the inverter circuit INV4. The source of the transistor Qn2 is connected to a node N2, and its drain is connected via the transistor Qn5 to the input of the inverter circuit INV4. The source of the transistor Qn3 is connected to a node N3, and its drain is connected via the transistor Qn6 to the input of the inverter circuit INV4. The source of the transistor Qn4 is connected to a node N4, and its drain is connected via the transistor Qn6 to the input of the inverter circuit INV4. The output of the inverter circuit INV4 is connected to the output node Y.

Gates of the transistors Qn1 and Qn3 are connected to the input node B. Gates of the transistors Qn2 and Qn4 are connected to the output of the inverter circuit INV2 inverting the logic of the signal of the input node B. The gate of the transistor Qn5 is connected to the input node A. The gate of the transistor Qn6 is connected to the output of the inverter circuit INV1 inverting the logic of the signal of the input node A.

The transistor Qp1 pulls up the input of the inverter circuit INV4 when the output of the inverter circuit INV4 is at the low level. The source of the transistor Qp1 is connected to the power supply VDD, its drain is connected to the input of the inverter circuit INV4, and its gate is connected to the output of the inverter circuit INV4.

The inverter circuit INV3 inverts the logic of the signal of an input node C.

The logical function of the above LookUp Table is determined in response to signals input to the nodes N1 to N4. Notations "P11" to "P44" in FIG. 12 indicate positions where vias for inputting various signals to the nodes N1 to N4 are provided. At positions P11 to P41, vias for applying the power supply voltage VDD to the nodes N1 to N4 are provided. At positions P12 to P42, vias for applying the reference potential VSS to the nodes N1 to N4 are provided. At positions P13 to P43, vias for connecting the nodes N1 to N4 and the input node C are provided. At positions P14 to P44, vias for connecting the nodes N1 to N4 and an output node Cb of the inverter circuit are provided.

The inverter circuit INV5 inverts the logic of the output signal of the above LookUp Table, that is, the output signal of the inverter circuit INV4, and outputs it to the output node Yb.

The transistors Qn7 to Qn13 form a circuit for inputting test signals to the LookUp Table in the operation mode for inspecting circuit cells (hereinafter described as a "test mode").

A drain of the transistor Qn7 is connected to an input node Ta of the test signal, and its source is connected to an input node A. The drain of the transistor Qn8 is connected to an input node Tb of the test signal, and its source is connected to an input node B. The drain of the transistor Qn9 is connected to an input node Tc of the test signal, and its source is connected to an input node C. Gates of the transistors Qn7 to Qn9 are commonly connected to a node Tmod set at the high level in the test mode.

The drain of the transistor Qn10 is connected to the node N1. The drain of the transistor Qn11 is connected to the node N2. The drain of the transistor Qn12 is connected to the node N3. The drain of the transistor Qn13 is connected to the node N4. Sources of the transistors Qn10 to Qn13 are commonly connected to the output node Cb of the inverter circuit INV3, and their gates are commonly connected to the node Tmod.

The transistor Qn14 outputs the signal indicating the test result of the above LookUp Table to the inspection output line SL in the test mode. The drain of the transistor Qn14 is connected to the output node Yb, its source is connected to an inspection output line SL, and its gate is connected to a column selection line CL. When the column selection line CL is set at the high level by a column selection circuit 10 mentioned later, the transistor Qn14 becomes the on state, and the output signal of the circuit cell output from the output node Yb is output to the inspection output line SL via the transistor Qn14.

According to the circuit cell having the above configuration, the logical function thereof is determined according to whether or not a via is provided at each of the positions P11 to P44.

For example, when vias are provided at positions P12, P21, P31, and P41, a two-input NAND circuit, using the nodes A and B as the input and using the node Yb as the output, is realized. Namely, when the node A is at the low level, the transistor Qn6 turns on and, at the same time, one of the transistors Qn3 and Qn4 turns on. For this reason, the input of the inverter circuit INV4 is driven to the power supply voltage VDD via the transistors Qn3 and Qn6 or the transistors Qn4 and Qn6, and the node Yb becomes the high level. When the node B is at the low level, the transistors Qn2 and Qn4 turn on and, at the same time, the transistor Qn5 or Qn6 turns on. For this reason, the input of the inverter circuit INV4 is driven to the power supply voltage VDD via the transistors Qn2 and Qn5 or the transistors Qn4 and Qn6, and the node Yb becomes the high level. When both of the nodes A and B are at the high level, the transistors Qn1 and Qn5 turn on, and the transistor Qn6 turns off; therefore, the input of the inverter circuit INV4 is driven to the reference potential VSS via the transistors Qn1 and Qn5, and the node Yb becomes the low level. In this way, a NAND function, whereby the output node Yb becomes the high level when either of the input node A or B is at the low level, and the output node Yb becomes the low level when both of the input nodes A and B are at the high level, is realized.

Further, in the test mode in which the node Tmod is set at the high level, all of transistors Qn7 to Qn13 turn on. Due to this, the input nodes A to B of the circuit cell receive as input predetermined inspection signals from the inspection use input nodes Ta to Tc. Further, the input signals of the nodes N1 to N4 are all set at the high level or the low level in response to the signal input from the node Tc. It is checked whether or not the logical functions of the three-input LookUp Table (Qn1 to Qn6, Qp1, INV1 to INV4) and the inverter circuit INV5 are normal by comparing the inspection signals input to the input nodes Ta to Tc and the signal of the inspection result output from the node Yb.

Figure 13:
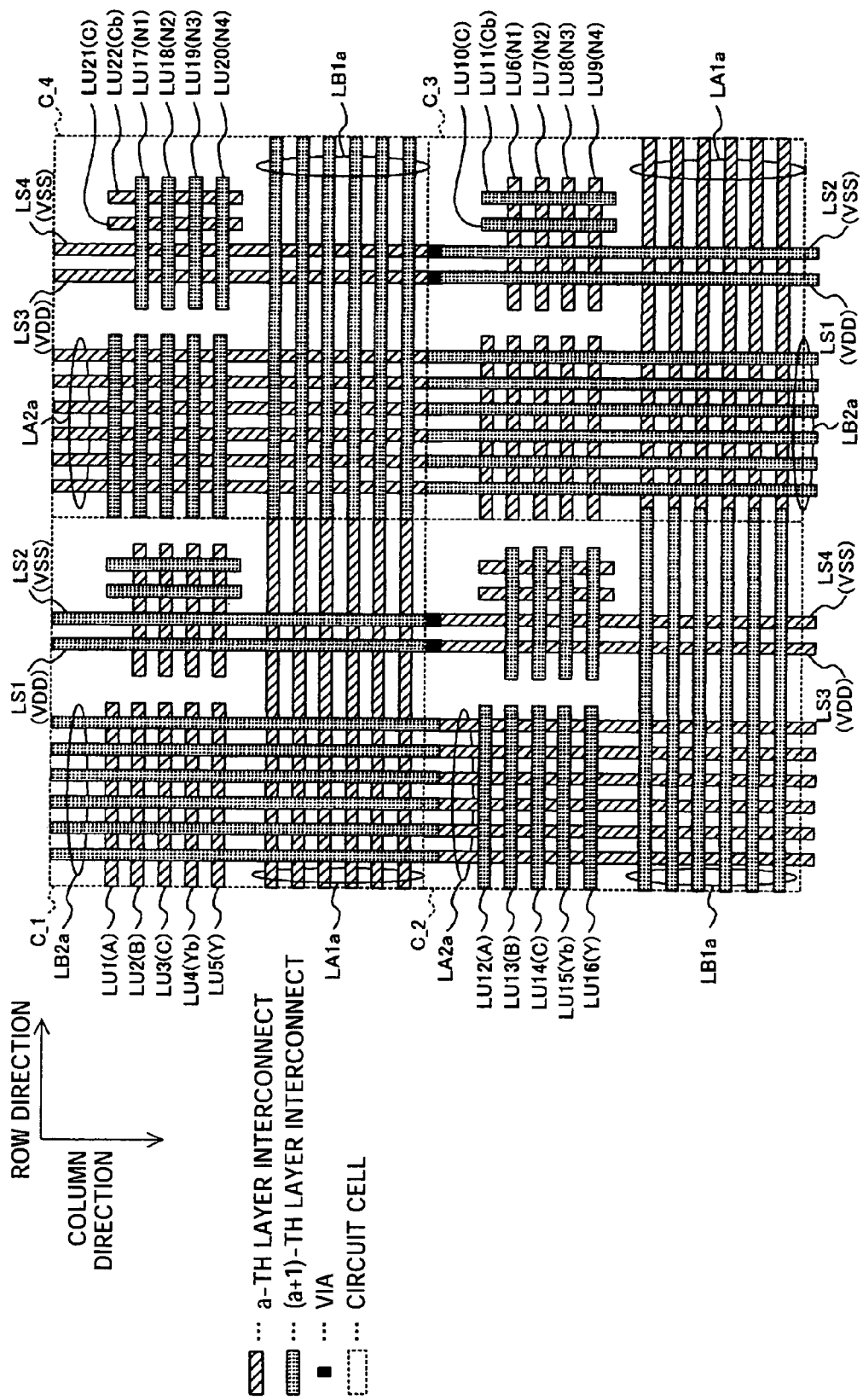
FIG. 13 is a view of an example of an interconnect structure of a semiconductor integrated circuit according to the present embodiment having the circuit cell shown in FIG. 12.

FIG. 13 is a view of an example of an interconnect structure of a semiconductor integrated circuit according to the present embodiment having the circuit cell shown in FIG. 12. In FIG. 13, interconnect groups LA1a and LB1a are embodiments of the first interconnect group of the present invention, while the interconnect groups LA2a and LB2a are embodiments of the second interconnect group of the present invention.

The interconnect group LA1a corresponds to the previously explained interconnect group LA1 in FIG. 3 and has the same structure as that of the interconnect group LA1 except for the point that the number of interconnects is six. The interconnect group LA2a corresponds to the previously explained interconnect group LA2 in FIG. 3 and has the same structure as that of the interconnect group LA2 except for the point that the number of interconnects is six. The interconnect group LB1a corresponds to the previously explained interconnect group LB1 in FIG. 2 and has the same structure as that of the interconnect group LB1 except for the point that the number of interconnects is six. The interconnect group LB2a corresponds to the previously explained interconnect group LB2 in FIG. 2 and has the same structure as that of the interconnect group LB2 except for the point that the number of interconnects is six.

In the regions of the circuit cells C_1 and C_3, interconnect groups LA1a and LB2a are formed. In the regions of the circuit cells C_2 and C_4, interconnect groups LA2a and LB1a are formed.

Further, in the interconnect structure shown in FIG. 13, other than the above interconnect groups, various types of interconnects connecting elements inside circuit cells are formed in the same interconnect layer as the interconnect groups.

In the regions of the circuit cells C_1 and C_3 in which the interconnect groups LA1a and LB2a are formed, interconnects LU1 to LU5 connected to the input/output nodes of the circuit cells, interconnects LU6 to LU9 connected to the program use nodes, interconnects LU10 and LU11 connected to internal nodes of the circuit cells, and power supply interconnects LS1 and LS2 are formed.

The interconnects LU1, LU2, LU3, LU4, and LU5 are interconnects of the a-th layer connected to the input node A, the input node B, the input node C, the output node Yb, and the output node Y and formed are aligned in the column direction in that order. All of the interconnects LU1 to LU5 are formed while extending in the row direction and are arranged at positions crossing the interconnect group LB2a of the (a+1)-th layer across the layer.

The interconnects LU6, LU7, LU8, and LU9 are interconnects of the a-th layer connected to the program use nodes N1, N2, N3, and N4 for the logical function and are formed aligned in the column direction in that order. All of interconnects LU6 to LU9 are formed while extending in the row direction and are arranged at positions crossing the interconnects LS1, LS2, LU10, and LU11 of the (a+1)-th layer across the layer.

The interconnect LS1 is an interconnect of the (a+1)-th layer for supplying the power supply voltage VDD to the circuit cells and is formed extending in the column direction. The interconnect LS2 is an interconnect of the (a+1)-th layer for supplying the reference potential VSS to the circuit cells and is formed extending in the column direction.

The interconnect LU10 is an interconnect of the (a+1)-th layer connected to the input node C and is formed extending in the column direction. The interconnect LU10 is formed at a position crossing the interconnects LU6 to LU9 of the a-th layer across the layer.

The interconnect LU11 is an interconnect of the (a+1)-th layer connected to the output node Cb of the inverter circuit INV3 and is formed extending in the column direction. The interconnect LU11 is formed at a position crossing the interconnects LU6 to LU9 of the a-th layer across the layer.

In the regions of the circuit cells C_2 and C_4 in which the interconnect groups LA2a and LB1a are formed, the interconnects LU12 to LU16 connected to the input/output nodes of the circuit cells, the interconnects LU17 to LU20 connected to the program use nodes, the interconnects LU21 and LU22 connected to the internal nodes of the circuit cells, and the power supply interconnects LS3 and LS4 are formed.

The interconnects LU12, LU13, LU14, LU15, and LU16 are interconnects of the (a+1)-th layer connected to the input node A, input node B, input node C, output node Yb, and output node Y and are formed aligned in the column direction in that order. All of the interconnects LU12 to LU16 are formed extending in the row direction and are arranged at positions crossing the interconnect group LA2a of the a-th layer across the layer.

The interconnects LU17, LU18, LU19, and LU20 are interconnects of the (a+1)-th layer connected to the nodes N1, N2, N3, and N4 used for programming the logical functions and are formed aligned in the column direction in that order. All of the interconnects LU17 to LU20 are formed extending in the row direction and are arranged at positions crossing the interconnects LS3, LS4, LU21, and LU22 of the a-th layer across the layer.

The interconnect LS3 is an interconnect of the a-th layer for supplying the power supply voltage VDD to the circuit cells and is formed extending in the column direction. The interconnect LS3 has a part overlapping with the interconnect LS1 of the circuit cell adjacent in the column direction between layers, and the overlapping parts are connected by a via.

The interconnect LS4 is an interconnect of the a-th layer for supplying the reference potential VSS to the circuit cells and is formed extending in the column direction. The interconnect LS4 has a part overlapping with the interconnect LS2 of the circuit cell adjacent in the column direction between layers, and the overlapping parts are connected by a via.

The interconnect LU21 is an interconnect of the a-th layer connected to the input node C and is formed extending in the column direction. The interconnect LU21 is formed at a position crossing the interconnects LU17 to LU20 of the (a+1)-th layer across the layer.

The interconnect LU22 is an interconnect of the a-th layer connected to the output node Cb of the inverter circuit INV3 and is formed extending in the column direction. The interconnect LU22 is formed at a position crossing the interconnects LU17 to LU20 of the (a+1)-th layer across the layer.

Figure 14:
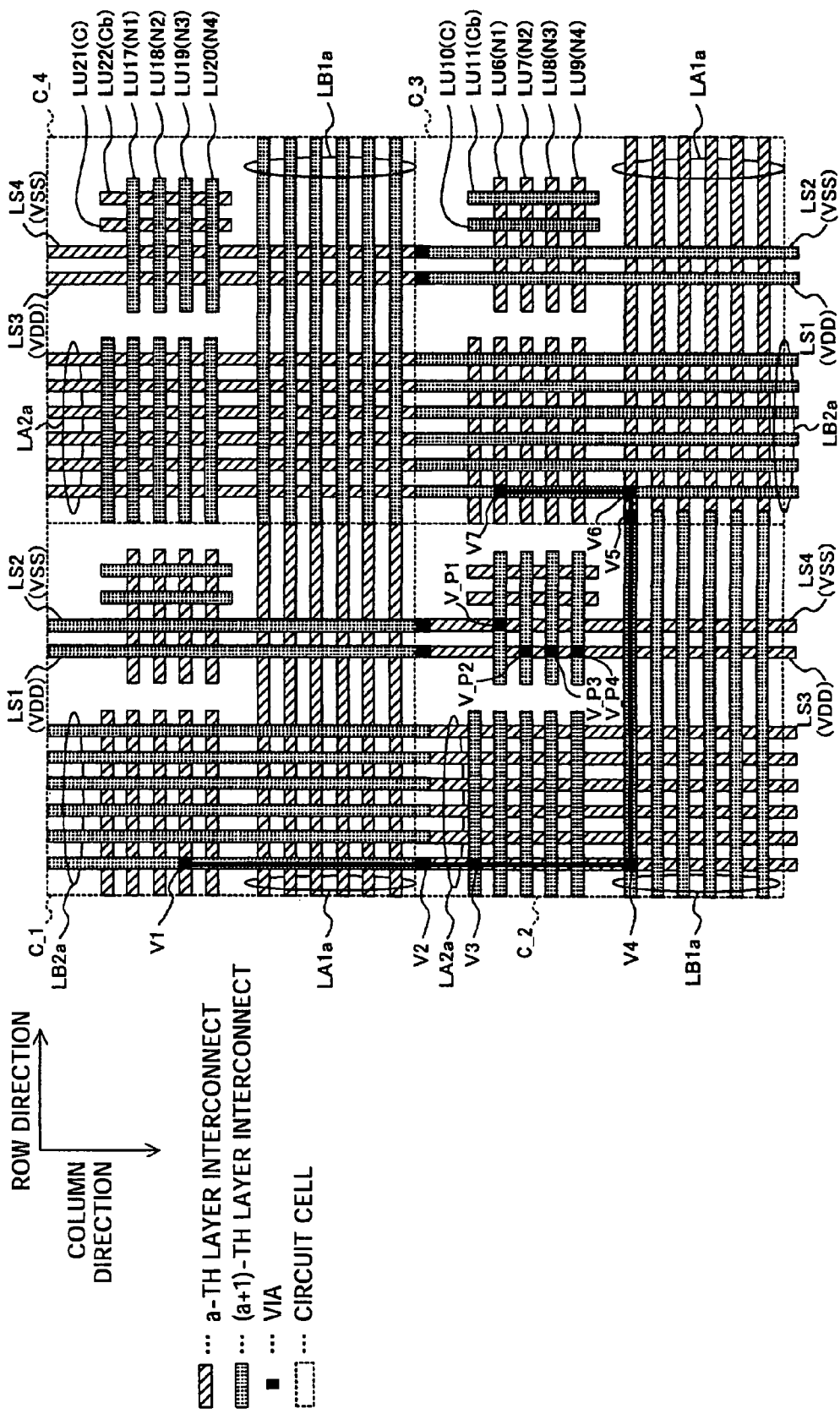
FIG. 14 is a view of an example of an interconnect pattern in the interconnect structure shown in FIG. 13.

FIG. 14 is a view of an example of an interconnect pattern in the interconnect structure explained above. In FIG. 14, the circuit cells C_1 and C_2 are adjacent in the column direction, the circuit cells C_2 and C_3 are adjacent in the row direction, the circuit cells C_3 and C_4 are adjacent in the column direction, and the circuit cells C_4 and C_1 are adjacent in the row direction.

The interconnect LU4 (output node Yb) of the circuit cell C_1 is connected to the interconnect LU12 (input node A) of the circuit cell C_2 through the route formed by the via V1, the interconnect group LB2a, the via V2, the interconnect group LA2a, and the via V3 and, at the same time, is further connected to the interconnect LU2 (input node B) of the circuit cell C_3 through the route formed by the interconnect group LA2a connected to this via V3, the via V4, the interconnect group LB1a, the via V5, the interconnect group LA1a, the via V6, the interconnect group LB2a, and the via 7. Namely, according to the example of FIG. 14, the interconnect pattern connecting the output node Yb of the circuit cell C_1 and the input node A of the circuit cell C_2 and the input node B of the circuit cell C_3 is formed by the vias V1 to V7.

Further, the interconnect LU17 (N1) of the circuit cell C_2 is connected to the interconnect LS4 (VSS) via a via V_P1, and the interconnects LU18 to LU20 (N2 to N4) are connected to the interconnect LS3 (VDD) via vias V_P2 to V_P4. Due to this, the case becomes equivalent to the case where vias are formed at positions P12, P21, P31, and P41 (FIG. 12); therefore, the circuit cell C_2 shown in the example of FIG. 14 has a logical function equivalent to a two-input NAND circuit.

Figure 15:
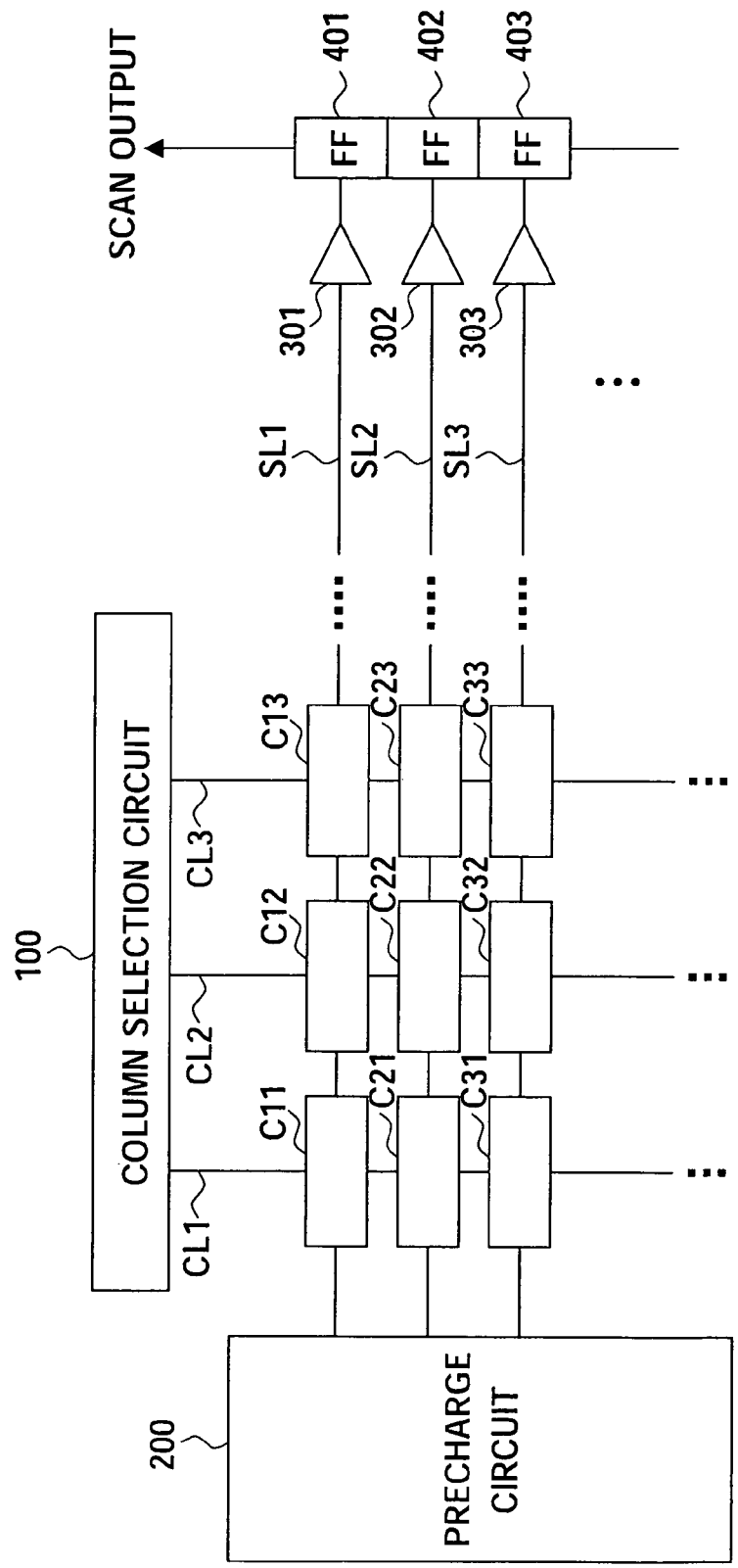
FIG. 15 is a view of an example of circuits involved in inspection of circuit cells.

Next, the inspection method of the circuit cell in the semiconductor integrated circuit according to the present embodiment will be explained. FIG. 15 is a view of an example of circuits involved in the inspection of the circuit cells. The same notations shown in FIG. 1 and FIG. 15 indicate the same components.

The semiconductor integrated circuit according to the present embodiment has, as circuits involved in the inspection of circuit cells, a column selection circuit 100, a precharge circuit 200, sense amplifiers 301, 302, 303, . . . , and scan flip-flops 401, 402, 403, . . . .

The column selection circuit 100 sequentially sets the column selection lines CL1, CL2, CL3, . . . at the high level in the test mode for inspecting the circuit. Note, the column selection lines CL1, CL2, CL3, . . . are commonly connected to circuit cells belonging to the first column, the second column, the third column, . . . of the circuit cell array. When, for example, a column selection line CLi in an i-th column is set at the high level by the column selection circuit 100, the transistors Qn14 turn on in circuit cells connected to this column selection line CLi. As a result, signals indicating the inspection results of circuit cells in the i-th column are output to the inspection output lines SL1, SL2, SL3, . . . .

The precharge circuit 200 precharges the inspection output lines SL1, SL2, SL3, . . . to the power supply voltage VDD before the column selection lines are set at the high level in the column selection circuit 100. Note that the inspection output lines SL1, SL2, SL3, . . . are commonly connected to circuit cells belonging to the first row, the second row, the third row, . . . of the circuit cell array.

The sense amplifiers 301, 302, 303, . . . amplify signals of inspection results of circuit cells output to the inspection output lines SL1, SL2, SL3, . . . .

The scan flip-flops 401, 402, 403, . . . latch the signals of inspection results amplified at the sense amplifiers 301, 302, 303, . . . and convert them to serial data and output the same.

Figure 16:
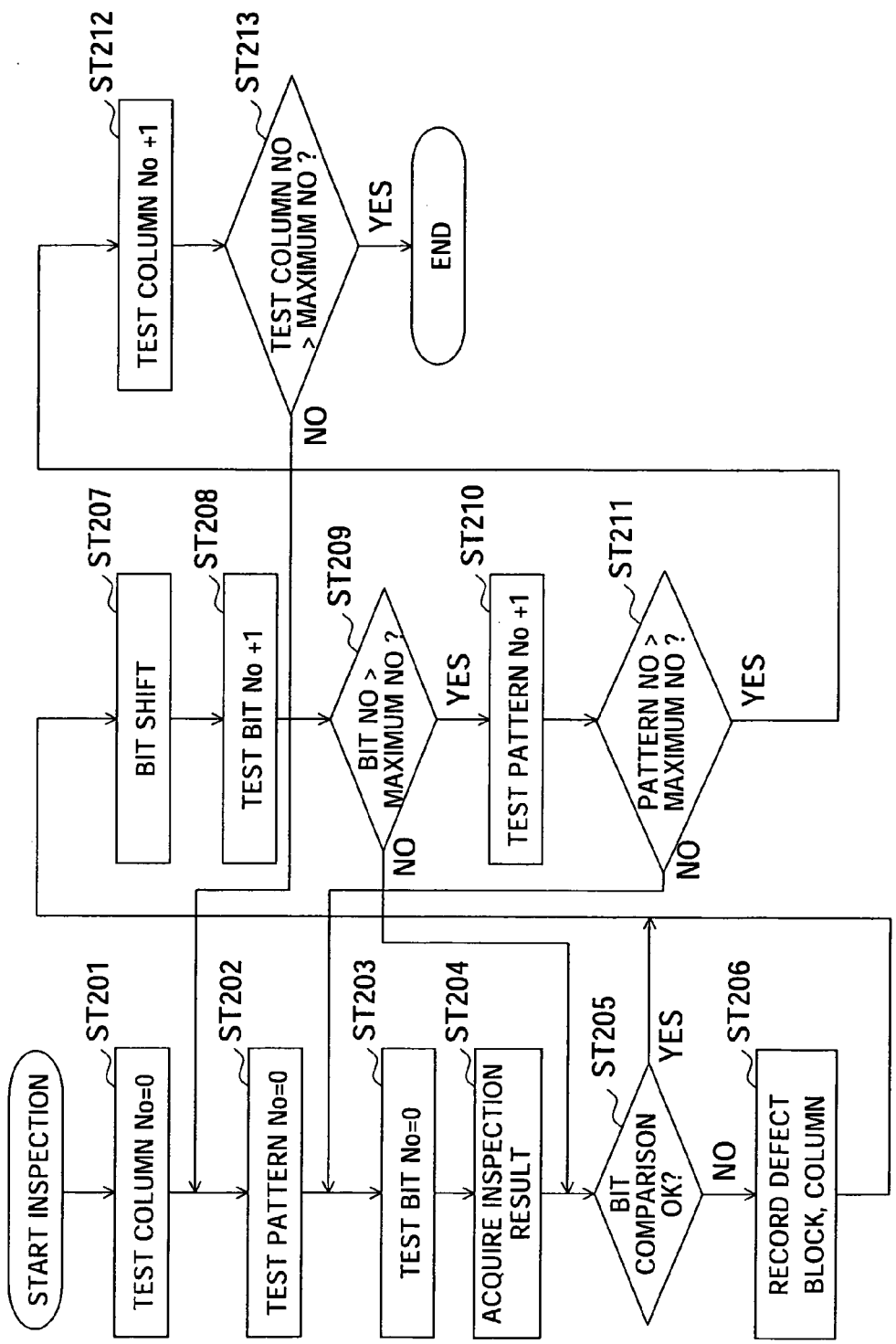
FIG. 16 is a flow chart illustrating an example of inspection processing by the circuits shown in FIG. 15.

FIG. 16 is a flow chart illustrating an example of the inspection processing according to the circuit shown in FIG. 15.

First, at the time of the start of the inspection, a number indicating the column of the test object (hereinafter described as a "test column no."), a number indicating the pattern of the test signal (hereinafter described as a "test pattern no."), and a number indicating the row of the test object (hereinafter described as a "test bit no.") are initialized to "0" (steps ST201 to ST203).

Then, test signals indicated by the test pattern no. are supplied from a inspection device (not shown) to the circuit cell. For example, in the case of the circuit cell shown in FIG. 12, test signals are supplied from an inspection device (not shown) to input terminals Ta, Ta, Tb, and Tc. Further, the terminal Tmod of each circuit cell is set at the high level and, at the same time, the column selection line of the column indicated by the test column no. is set at the high level by the column selection circuit 100. When the terminal Tmod becomes the high level, the test signal of the inspection device is input to each circuit cell. Then, the signal of the inspection result in response to this test signal is output from each circuit cell. At this time, in the circuit cell of the column in which the column selection line is set at the high level, the transistor Qn14 becomes the on state. The signal of the output terminal Y1b is output via the transistor Q14 to the inspection output lines SL1, SL2, SL3, . . . . The signals of the inspection output lines SL1, SL2, SL3, . . . are amplified at the sense amplifiers 301, 302, 303, . . . , and latched at the scan flip-flops 401, 402, 403, . . . (step ST204).

Among the data latched at the scan flip-flops 401, 402, 403, . . . , the data of the row indicated by the test bit no. is compared with an expected value (step ST205). When it is different from the expected value, the information of the block and column of the circuit cell outputting this data is recorded as the information of a circuit cell having a defect (step ST206). When it coincides with the expected value, the data of the scan flip-flops 401, 402, 403, . . . are shifted by 1 bit (step ST207), and "1" is added to the test bit no. (step ST208). At this time, where the test bit no. does not reach the predetermined maximum value (namely the number indicating the last row), the processing of steps ST205 to ST208 explained above is repeated for the data of the next row corresponding to the test bit no. increased by "1".

When it is judged that the test bit no. has reached the predetermined maximum value (that is, the number indicating the last row) (step ST209), "1" is added to the test pattern no. (step ST210). At this time, when the test pattern no. has not reach a predetermined maximum value (that is, the number indicating the last pattern), the next test pattern corresponding to the test pattern no. increasd by "1" is generated in a not shown inspection device, and the processing of steps ST203 to ST210 explained above is repeated.

When it is judged that the test pattern no. has reached the predetermined maximum value (that is, the number indicating the last pattern) (step ST211), "1" is added to the test column no. At this time, when the test column no. does not reach the predetermined maximum value (that is, the number indicating the last column), the next column corresponding to the test column no. increased by "1" becomes the inspection target. Namely, the column selection signal of the next column is set at the high level by the column selection circuit 100, and the processing of steps ST202 to ST212 explained above is repeated. When it is judged that the test column no. reaches the predetermined maximum value (that is, the number indicating the last column) (step ST213), the inspection of all circuit cells ends.

While an embodiment of the present invention was explained in detail above, the present invention is not limited to only the above embodiment and includes various variations.

The via used for customizing the interconnects in the embodiment explained above may be formed by using a mask or formed without using a mask by an EB system or the like.

In the above embodiment, an example in which the first interconnects included in the first interconnect groups (LA1, LB1, etc.) belonging to the same column uniformly have the same length, and the second interconnects included in the second interconnect groups (LA2, LB2, etc.) belonging to the same row uniformly have the same length was explained, but the present invention is not limited to this. Namely, interconnects having different lengths may be included in the first interconnects included in the first interconnect groups (LA1, LB1, etc.) belonging to the same column. Further, interconnects having different lengths may be included in the second interconnects included in the second interconnect groups (LA2, LB2, etc.) belonging to the same row.

In the above embodiment, an example in which both ends of the first interconnects included in the first interconnect groups (LA1, LB1, etc.) belonging to the same column are aligned in the column direction, and both ends of the second interconnects included in the second interconnect groups (LA2, LB2, etc.) belonging to the same row are aligned in the row direction are explained, but the present invention is not limited to this. Namely, between two ends of the first interconnects (at least part) included in the first interconnect groups (LA1, LB1, etc.) belonging to the same column, only one ends may also be aligned in the column direction as well. Further, between two ends of second interconnects (at least part) included in the second interconnect groups (LA2, LB2, etc.) belonging to the same row, only one ends may also be aligned in the row direction.

In the above embodiment, an example in which the numbers of the first interconnects included in the first interconnect groups (LA1, LB1, etc.) extended in the row direction are equal in all rows, and the numbers of the second interconnects included in the second interconnect groups (LA2, LB2, etc.) extended in the column direction are equal in all columns is mentioned, but the present invention is not limited to this. For example, it is also possible for the first interconnect groups in the same row to include first interconnects having numbers equal to each other, and first interconnect groups of different rows to include first interconnects having different numbers. In the same way, it is also possible for the second interconnect groups in the same column to include second interconnects having numbers equal to each other, and second interconnect groups of different columns to include second interconnects having different numbers.

FIG. 6 shows an example of expanding the interconnect structure shown in FIG. 2 to three layers, but the present invention is not limited to this. It is also possible to extend this interconnect structure to four or more layers. Further, it is possible to extend also the interconnect structure shown in FIG. 8 to three or more layers. Further, a structure stacking the interconnect structure shown in FIG. 2 and the interconnect structure shown in FIG. 8 on each other can be employed too.

Part of the interconnects included in the interconnect groups LD2 and LE2 are divided into two segments in the interconnect structure shown in FIG. 8, but the present invention is not limited to this. They can be divided into two or more segments too. In this case, an interconnect L3 sandwiched between two row direction interconnects may be provided inside each of the interconnect groups LD1 and LE1 as an interconnect for connecting segments. Due to this, it becomes possible to form the via in each segment and change the interconnects, and the resource of interconnects in the column direction can be further increased.

In the interconnect structure shown in FIG. 13, the interconnect group forming the connection outside the circuit cell and the program use interconnect inside the circuit cell are formed in the same interconnect layer, but the present invention is not limited to this. The program use interconnect inside the circuit cell may be formed in for example, a lower layer than the interconnect group forming the connection outside the circuit cell as well. Due to this, it becomes possible to make structures of all circuit cells the same.

Specific numeric values (number of interconnects, number of interconnect layers etc.) shown in the above embodiment were mentioned as an example for explanation. These numerical values can be changed to any other values.

It should be understood by those skilled in the art that various modifications, combinations, sub-combinations and alterations may occur depending on design requirements and other factors insofar as they are within the scope of the appended claims or the equivalents thereof.

We claim:

1. A semiconductor integrated circuit comprising:
   a plurality of interconnect layers; and
   at least one via connecting interconnects of two adjacent interconnect layers, wherein
   each interconnect layer comprises a plurality of first interconnect groups and a plurality of second interconnect groups arranged in a matrix,
   each first interconnect group comprises a plurality of first interconnects extending in a row direction of the matrix and arranged side by side in a column direction of the matrix,
   each second interconnect group comprises a plurality of second interconnects extending in the column direction and arranged side by side in the row direction,
   the first interconnect groups and the second interconnect groups are alternately arranged in each row and in each column of the matrix,
   the first interconnect groups and the second interconnect groups are arranged facing each other between two adjacent interconnect layers,
   the first interconnect groups and the second interconnect groups facing each other between the layers have crossing parts where they can be connected through vias,
   each first interconnect group and the first interconnect groups adjacent in the row direction to the second interconnect group facing that first interconnect group between layers comprise overlapping parts where they can be connected through vias, and
   each second interconnect group and the second interconnect groups adjacent in the column direction to the first interconnect group facing that second interconnect group between layers have overlapping parts where they can be connected through vias.

2. A semiconductor integrated circuit as set forth in claim 1, wherein:
   at least a part of the first interconnects included in the first interconnect groups belonging to the same column of the matrix has at least one of the two ends thereof aligned in the column direction, and
   at least a part of the second interconnects included in the second interconnect groups belonging to the same row of the matrix has at least one of the two ends thereof aligned in the row direction.

3. A semiconductor integrated circuit as set forth in claim 2, wherein:
   the at least part of the first interconnects included in the first interconnect groups belonging to the same column of the matrix and having ends aligned in the column direction have common lengths, and
   the at least part of the second interconnects included in the second interconnect groups belonging to the same row of the matrix and having ends aligned in the row direction have common lengths.

4. A semiconductor integrated circuit as set forth in claim 1, wherein
   the first interconnect groups belonging to the same row of the matrix include equal numbers of first interconnects, and
   the second interconnect groups belonging to the same column of the matrix include equal numbers of second interconnects.

5. A semiconductor integrated circuit as set forth in claim 1, having a plurality of circuit cells arranged in the row direction and the column direction of the matrix.

6. A semiconductor integrated circuit as set forth in claim 1, wherein:
   the plurality of interconnect layers include an adjacent first interconnect layer and second interconnect layer,
   each of the first interconnect groups included in the first interconnect layer and the second interconnect layer further has at least one third interconnect sandwiched between two predetermined first interconnects and extending in the column direction,
   each of the second interconnect groups included in the first interconnect layer and the second interconnect layer includes a second interconnect divided into at least two segments, and
   each third interconnect formed in one of the first interconnect layer and the second interconnect layer and two segments of a second interconnect formed in the other have overlapping parts where they can be connected through vias.

7. A semiconductor integrated circuit as set forth in claim 6, wherein:
   at least a part of the first interconnects included in the first interconnect groups belonging to the same column of the matrix have at least one of the two ends thereof aligned in the column direction, and
   at least a part of the second interconnects included in the second interconnect groups belonging to the same row of the matrix have at least one of the two ends thereof aligned in the row direction.

8. A semiconductor integrated circuit as set forth in claim 7, wherein:
   the at least part of the first interconnects included in the first interconnect groups belonging to the same column of the matrix and having ends aligned in the column direction have common lengths, and
   the at least part of the second interconnects included in the second interconnect groups belonging to the same row of the matrix and having ends aligned in the row direction have common lengths.

9. A semiconductor integrated circuit as set forth in claim 6, wherein
   the first interconnect groups belonging to the same row of the matrix include equal numbers of first interconnects, and
   the second interconnect groups belonging to the same column of the matrix include equal numbers of second interconnects.

10. A semiconductor integrated circuit as set forth in claim 6, having a plurality of circuit cells arranged in the row direction and the column direction of the matrix.

* * * * *

UNITED STATES PATENT AND TRADEMARK OFFICE
CERTIFICATE OF CORRECTION

PATENT NO. : 7.271,488 B2  
APPLICATION NO. : 11/312709  
DATED : September 18, 2007  
INVENTOR(S) : Tomofumi Arakawa et al.

It is certified that error appears in the above-identified patent and that said Letters Patent is hereby corrected as shown below:

Column 19, Line 48:
"the at least" should read -- at least --.

Column 19, Line 52:
"the at least" should read -- at least --.

Column 20, Line 39:
"the at least" should read -- at least --.

Column 20, Line 43:
"the at least" should read -- at least --.

Signed and Sealed this

Twenty-fifth Day of December, 2007

JON W. DUDAS  
*Director of the United States Patent and Trademark Office*